United States Patent
Zhang et al.

(10) Patent No.: US 12,270,875 B2
(45) Date of Patent: Apr. 8, 2025

(54) SYSTEMS AND METHODS FOR IMPROVING OUTPUT STABILITY OF A RADIO FREQUENCY POWER AMPLIFIER BY GAIN COMPENSATION AND CORRECTION

(71) Applicant: WUHAN UNITED IMAGING HEALTHCARE CO., LTD., Hubei (CN)

(72) Inventors: Peng Zhang, Shanghai (CN); Hui Zhu, Shanghai (CN); Jifeng Chen, Shanghai (CN); Xu Chu, Shanghai (CN); Bin Cao, Shanghai (CN); Yinqi Wang, Shanghai (CN)

(73) Assignee: WUHAN UNITED IMAGING HEALTHCARE CO., LTD., Wuhan (CN)

( * ) Notice: Subject to any disclaimer, the term of this patent is extended or adjusted under 35 U.S.C. 154(b) by 229 days.

(21) Appl. No.: 17/812,717

(22) Filed: Jul. 14, 2022

(65) Prior Publication Data
US 2023/0015849 A1    Jan. 19, 2023

(30) Foreign Application Priority Data
Jul. 14, 2021    (CN) .......................... 202110797731.3

(51) Int. Cl.
*G01R 33/36* (2006.01)
(52) U.S. Cl.
CPC ................................ *G01R 33/3614* (2013.01)

(58) Field of Classification Search
CPC . G01R 33/3614; H03F 1/3247; H03F 1/3258; H03F 3/195; H03F 3/213;
(Continued)

(56) References Cited

U.S. PATENT DOCUMENTS

| | | | |
|---|---|---|---|
| 5,574,993 A | 11/1996 | Kobayashi et al. | |
| 2004/0032296 A1* | 2/2004 | Akaiwa ................. | H03F 1/3247 330/136 |

(Continued)

FOREIGN PATENT DOCUMENTS

| | | |
|---|---|---|
| CN | 201150049 Y | 11/2008 |
| CN | 101447770 A | 6/2009 |

(Continued)

OTHER PUBLICATIONS

The Extended European Search Report in European Application No. 22185049.8 mailed on Dec. 12, 2022, 12 pages.

*Primary Examiner* — Jay Patidar
(74) *Attorney, Agent, or Firm* — METIS IP LLC

(57) ABSTRACT

Systems and methods for improving output stability of an RFPA. The systems may obtain an initial radio frequency signal to be amplified by the RFPA. The systems may also generate a compensated radio frequency signal by performing, based on a preset compensation rule and a set of compensation parameters, a gain compensation operation for the initial radio frequency signal. The set of compensation parameters may include a supply voltage of the RFPA and a transistor junction temperature of the RFPA. The systems may further generate, by performing a non-linear correction operation on the compensated radio frequency signal, a corrected radio frequency signal, which is transmitted to the RFPA.

20 Claims, 9 Drawing Sheets

(58) Field of Classification Search
CPC .............. H03F 3/245; H03G 2201/206; H03G 2201/307; H03G 3/3042
See application file for complete search history.

(56) References Cited

U.S. PATENT DOCUMENTS

| | | |
|---|---|---|
| 2010/0210231 A1 | 8/2010 | Li et al. |
| 2011/0025414 A1 | 2/2011 | Wolf et al. |
| 2012/0283847 A1 | 11/2012 | Prieler et al. |
| 2020/0295790 A1* | 9/2020 | Langer .................. H03F 1/0222 |

FOREIGN PATENT DOCUMENTS

| | | |
|---|---|---|
| CN | 102098007 A | 6/2011 |
| CN | 103296976 A | 9/2013 |
| CN | 103138690 B | 6/2016 |
| CN | 106301247 A | 1/2017 |
| CN | 109787933 A | 5/2019 |
| CN | 110932568 A | 3/2020 |
| CN | 111030605 A | 4/2020 |
| CN | 113014207 A | 6/2021 |
| CN | 219302644 U | 7/2023 |
| EP | 1335489 A1 | 8/2003 |

* cited by examiner

SYSTEMS AND METHODS FOR IMPROVING OUTPUT STABILITY OF A RADIO FREQUENCY POWER AMPLIFIER BY GAIN COMPENSATION AND CORRECTION

CROSS-REFERENCE TO RELATED APPLICATIONS

This application claims priority of Chinese Application No. 202110797731.3, filed on Jul. 14, 2021, the contents of which are hereby incorporated by reference.

TECHNICAL FIELD

The present disclosure generally relates to the field of magnetic resonance technology, and more particularly, relates to systems and methods for improving output stability of a radio frequency power amplifier (RFPA) of a magnetic resonance imaging (MRI) system.

BACKGROUND

RFPA is a core component in an MRI system, which depends on the robust performance of the RFPA to produce reliable results. The RFPA amplifies radio frequency (RF) pulses, and the amplified RF pulses can drive RF coils of the MRI system for imaging. For stable MRI performance, the RFPA needs to maintain a stable gain for achieving desired imaging effects. However, RFPAs tend to demonstrate non-linear gain properties that may cause a non-linear distortions of the RF pulses when the RFPA operates in the saturation region or the cutoff region. Such distortions often include an amplitude distortion and a phase distortion in-band and/or a spectral spreading out-of-band, which would likely interfere with the signal transmission of an adjacent channel. Ultimately, in MRI imaging, it is important to reduce the occurrence of artifacts and distortions, which have the potential of damaging image quality, and affecting disease diagnosis and/or scientific research. Therefore, it is desirable to provide systems and methods for improving output stability of the RFPA of the MRI system, thereby improving the overall robustness (e.g., image quality) of the MRI system.

SUMMARY

In one aspect of the present disclosure, a system for improving output stability of a radio frequency power amplifier (RFPA) is provided. The system may include a first processing circuit and a second processing circuit. The first processing circuit may be configured to obtain an initial radio frequency signal to be amplified by the RFPA and generate a compensated radio frequency signal by performing, based on a preset compensation rule and a set of compensation parameters, a gain compensation operation for the initial radio frequency signal. The set of compensation parameters may include a supply voltage of the RFPA and a transistor junction temperature of the RFPA. The second processing circuit may be configured to generate, by performing a non-linear correction operation on the compensated radio frequency signal, a corrected radio frequency signal, which is transmitted to the RFPA.

In some embodiments, the set of compensation parameters may further include an output power of the RFPA.

In some embodiments, to generate a compensated radio frequency signal by performing, based on a preset compensation rule relating to a set of compensation parameters, a gain compensation operation for the initial radio frequency signal may be configured to determine a gain compensation quantity based on the preset compensation rule and the set of compensation parameters, and generate the compensated radio frequency signal based on the gain compensation quantity and the initial radio frequency signal. The preset compensation rule may include a series of mapping relationships between the gain compensation quantity and the set of compensation parameters.

In some embodiments, to determine a gain compensation quantity based on the preset compensation rule and the set of compensation parameters, the first processing circuit may be configured to determine a first compensation quantity based on the supply voltage of the RFPA and the output power of the RFPA; determine a second compensation quantity based on the output power of the RFPA and the transistor junction temperature of the RFPA; and determine the gain compensation quantity based on the first compensation quantity and the second compensation quantity.

In some embodiments, the series of mapping relationships between the gain compensation quantity and the set of compensation parameters may be listed in a gain compensation table.

In some embodiments, the series of mapping relationships between the gain compensation quantity and the set of compensation parameters may be determined by data fitting based on a function that incorporates the gain compensation quantity and the set of compensation parameters.

In some embodiments, the first processing circuit may be further configured to designate a sum of an ambient temperature and a transistor junction temperature rise of the RFPA as the transistor junction temperature of the RFPA.

In some embodiments, the first processing circuit may be further configured to calculate the transistor junction temperature rise of the RFPA based on a power dissipation of the RFPA and an equivalent thermal resistance of the RFPA.

In some embodiments, a frequency of the initial radio frequency signal may be in a range from 10 megahertz to 1000 megahertz.

In some embodiments, the initial radio frequency signal may be a pulse signal.

In some embodiments, a peak power of the RFPA may be greater than 8 kilowatts.

In another aspect of the present disclosure, a method for improving output stability of a radio frequency power amplifier (RFPA) is provided. The method may be implemented by one or more processing circuits operably connected with the RFPA. The method may include obtaining an initial radio frequency signal to be amplified by the RFPA. The method may also include generating a compensated radio frequency signal by performing, based on a preset compensation rule and a set of compensation parameters, a gain compensation operation for the initial radio frequency signal. The set of compensation parameters may include a supply voltage of the RFPA and a transistor junction temperature of the RFPA. The method may further include generating, by performing a non-linear correction operation on the compensated radio frequency signal, a corrected radio frequency signal, which is transmitted to the RFPA.

In some embodiments, the set of compensation parameters may further include an output power of the RFPA.

In some embodiments, the generating a compensated radio frequency signal by performing, based on a preset compensation rule relating to a set of compensation parameters, a gain compensation operation for the initial radio frequency signal may include determining a gain compensation quantity based on the preset compensation rule and the set of compensation parameters, and generating the compensated radio frequency signal based on the gain compensation quantity and the initial radio frequency signal. The preset compensation rule may include a series of mapping relationships between the gain compensation quantity and the set of compensation parameters In some embodiments, the determining a gain compensation quantity based on the preset compensation rule and the set of compensation parameters may include determining a first compensation quantity based on the supply voltage of the RFPA and the output power of the RFPA; determining a second compensation quantity based on the output power of the RFPA and the transistor junction temperature of the RFPA; and determining the gain compensation quantity based on the first compensation quantity and the second compensation quantity.

In some embodiments, the series of mapping relationships between the gain compensation quantity and the set of compensation parameters may be listed in a gain compensation table.

In some embodiments, the series of mapping relationships between the gain compensation quantity and the set of compensation parameters may be determined by data fitting based on a function that incorporates the gain compensation quantity and the set of compensation parameters.

In some embodiments, the operations may further include designating a sum of an ambient temperature and a transistor junction temperature rise of the transistor in the RFPA as the transistor junction temperature of the RFPA.

In some embodiments 1, a frequency of the initial radio frequency signal may be in a range from 10 megahertz to 1000 megahertz.

In another aspect of the present disclosure, a radio frequency system is provided. The system may include one or more processing circuits, an RFPA, and radio frequency coils. The one or more processing circuits may be configured to generate a compensated radio frequency signal by performing, based on a preset compensation rule and a set of compensation parameters, a gain compensation operation on an initial radio frequency signal to be amplified by the RFPA for improving output stability of the RFPA. The RFPA may be configured to generate an amplified radio frequency signal by amplifying the compensated radio frequency signal. The radio frequency coils may be configured to generate, after being driven by the amplified radio frequency signal, a radio frequency magnetic field for imaging.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities, and combinations set forth in the detailed examples discussed below.

BRIEF DESCRIPTION OF THE DRAWINGS

The present disclosure is further described in terms of exemplary embodiments. These exemplary embodiments are described in detail with reference to the drawings. The drawings are not to scale. These embodiments are non-limiting exemplary embodiments, in which like reference numerals represent similar structures throughout the several views of the drawings, and wherein.

DETAILED DESCRIPTION

In the following detailed description, numerous specific details are set forth by way of examples in order to provide a thorough understanding of the relevant disclosure. However, it should be apparent to those skilled in the art that the present disclosure may be practiced without such details. In other instances, well-known methods, procedures, systems, components, and/or circuitry have been described at a relatively high-level, without detail, in order to avoid unnecessarily obscuring aspects of the present disclosure. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown, but to be accorded the widest scope consistent with the claims.

The terminology used herein is for the purpose of describing particular example embodiments only and is not intended to be limiting. As used herein, the singular forms "a," "an," and "the" may be intended to include the plural forms as well, unless the context clearly indicates otherwise. It will be further understood that the terms "comprise," "comprises," and/or "comprising," "include," "includes," and/or "including," when used in this specification, specify the presence of stated features, integers, steps, operations, elements, and/or components, but do not preclude the presence or addition of one or more other features, integers, steps, operations, elements, components, and/or groups thereof.

It will be understood that the term "system," "unit," "module," and/or "block" used herein are one method to distinguish different components, elements, parts, section or assembly of different level in ascending order. However, the terms may be displaced by another expression if they achieve the same purpose.

Figure 3:
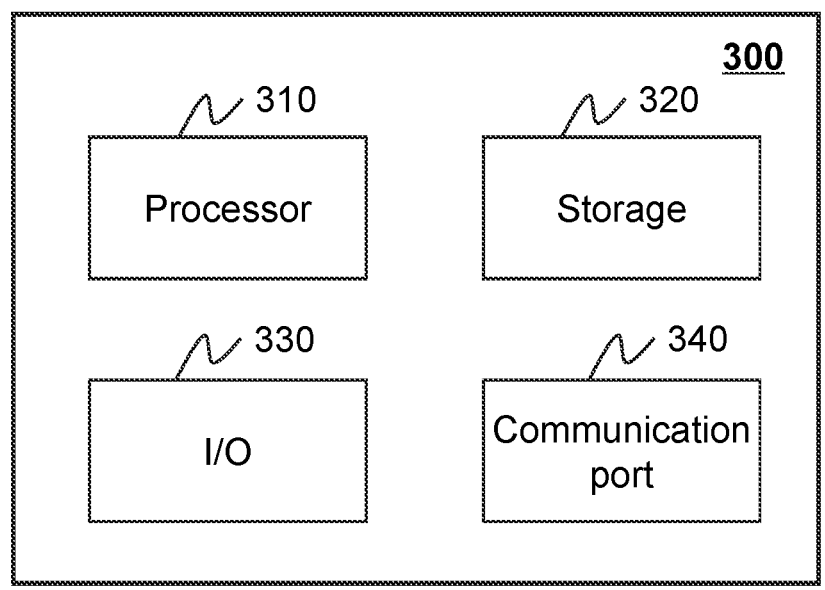
FIG. 3 is a schematic diagram illustrating hardware and/or software components of an exemplary computing device according to some embodiments of the present disclosure.

Generally, the word "module," "unit," or "block," as used herein, refers to logic embodied in hardware or firmware, or to a collection of software instructions. A module, a unit, or a block described herein may be implemented as software and/or hardware and may be stored in any type of non-transitory computer-readable medium or another storage device. In some embodiments, a software module/unit/block may be compiled and linked into an executable program. It will be appreciated that software modules can be callable from other modules/units/blocks or from themselves, and/or may be invoked in response to detected events or interrupts. Software modules/units/blocks configured for execution on computing devices (e.g., processor 310 as illustrated in FIG. 3) may be provided on a computer readable medium, such as a compact disc, a digital video disc, a flash drive, a magnetic disc, or any other tangible medium, or as a digital download (and can be originally stored in a compressed or installable format that needs installation, decompression, or decryption prior to execution). Such software code may be stored, partially or fully, on a storage device of the executing computing device, for execution by the computing device. Software instructions may be embedded in firmware, such as an EPROM. It will be further appreciated that hardware modules/units/blocks may be included of connected logic components, such as gates and flip-flops, and/or can be included of programmable units, such as programmable gate arrays or processors. The modules/units/blocks or computing device functionality described herein may be implemented as software modules/units/blocks, but may be represented in hardware or firmware. In general, the modules/units/blocks described herein refer to logical modules/units/blocks that may be combined with other modules/units/blocks or divided into sub-modules/sub-units/sub-blocks despite their physical organization or storage.

It will be understood that when a unit, engine, module or block is referred to as being "on," "connected to," or "coupled to," another unit, engine, module, or block, it may be directly on, connected or coupled to, or communicate with the other unit, engine, module, or block, or an intervening unit, engine, module, or block may be present, unless the context clearly indicates otherwise. As used herein, the term "and/or" includes any and all combinations of one or more of the associated listed items.

These and other features, and characteristics of the present disclosure, as well as the methods of operation and functions of the related elements of structure and the combination of parts and economies of manufacture, may become more apparent upon consideration of the following description with reference to the accompanying drawings, all of which form a part of this disclosure. It is to be expressly understood, however, that the drawings are for the purpose of illustration and description only and are not intended to limit the scope of the present disclosure. It is understood that the drawings are not to scale.

The flowcharts used in the present disclosure illustrate operations that systems implement according to some embodiments of the present disclosure. It is to be expressly understood the operations of the flowcharts may be implemented not in order. Conversely, the operations may be implemented in an inverted order, or simultaneously. Moreover, one or more other operations may be added to the flowcharts. One or more operations may be removed from the flowcharts.

Provided herein are systems and components for medical imaging and/or medical treatment. In some embodiments, the medical system may include an imaging system. The imaging system may include a single modality imaging system and/or a multi-modality imaging system. The single modality imaging system may include, for example, a magnetic resonance imaging (MRI) system. Exemplary MRI systems may include a superconducting magnetic resonance imaging system, a non-superconducting magnetic resonance imaging system, etc. The multi-modality imaging system may include, for example, a computed tomography-magnetic resonance imaging (MRI-CT) system, a positron emission tomography-magnetic resonance imaging (PET-MRI) system, a single photon emission computed tomography-magnetic resonance imaging (SPECT-MRI) system, a digital subtraction angiography-magnetic resonance imaging (DSA-MRI) system, etc. In some embodiments, the medical system may include a treatment system. The treatment system may include a treatment plan system (TPS), image-guide radiotherapy (IGRT), etc. The image-guide radiotherapy (IGRT) may include a treatment device and an imaging device. The treatment device may include a linear accelerator, a cyclotron, a synchrotron, etc., configured to perform a radio therapy on a subject. The treatment device may include an accelerator of species of particles including, for example, photons, electrons, protons, or heavy ions. The imaging device may include an MRI device, a CT scanner (e.g., cone beam computed tomography (CBCT) scanner), a digital radiology (DR) scanner, an electronic portal imaging device (EPID), etc.

In some embodiments, for illustration purposes, the MRI system including an RFPA is described in the following description. Generally, there are multiple schemes, e.g., feedforward schemes, feedback schemes, negative feedback schemes, predistortion schemes, etc., for improving the output stability of the RFPA. The feedforward scheme may include determining a preset gain for compensating a gain of an input signal of the RFPA. Different input signals corresponding to different input powers may correspond to the same preset gain. The feedback scheme may include directly suppressing an input signal of the RFPA based on an output signal of the RFPA. For example, the feedback scheme may include adjusting the input signal based on a difference between an input power corresponding to the input signal and an output power corresponding to the output signal. The negative feedback scheme may include adjusting the input signal by comparing the output signal and the input signal. The predistortion scheme may include a basic idea that involves inserting a pre-distorter in front of the RFPA for non-linear correction, and aiming to create linearization of the RFPA by using the pre-distorter and the RFPA in cascade. The curve characteristics of the pre-disorder may be reciprocal to the curve characteristics of the RFPA. However, some of these schemes often do not consider the influence of gain fluctuation of the RFPA on the compensation result of the input signal of the RFPA and/or a compensation effect or compensation speed is not satisfactory. Thus, it is desirable to provide effective systems and methods for gain compensation of the input signal of the RFPA, thereby improving output stability of the RFPA of the MRI system.

An aspect of the present disclosure relates to systems and methods for improving output stability of an RFPA. The systems may obtain an initial radio frequency signal to be amplified by the RFPA. The systems may also generate a compensated radio frequency signal by performing, based on a preset compensation rule and a set of compensation parameters, a gain compensation operation for the initial radio frequency signal. The set of compensation parameters includes a supply voltage of the RFPA and a transistor junction temperature of the RFPA. The systems may also generate, by performing a non-linear correction on the compensated radio frequency signal, a corrected radio frequency signal, which is transmitted to the RFPA.

According to some embodiments of the present disclosure, a gain compensation module may be designed and added to perform the gain compensation for the initial radio frequency signal to be amplified by the RFPA, which can compensate for an output power fluctuation of the RFPA that is caused by the set of compensation parameters, thereby achieving a stable output of the RFPA in different operating situations and improving the compensation effect for the RFPA.

Figure 1:
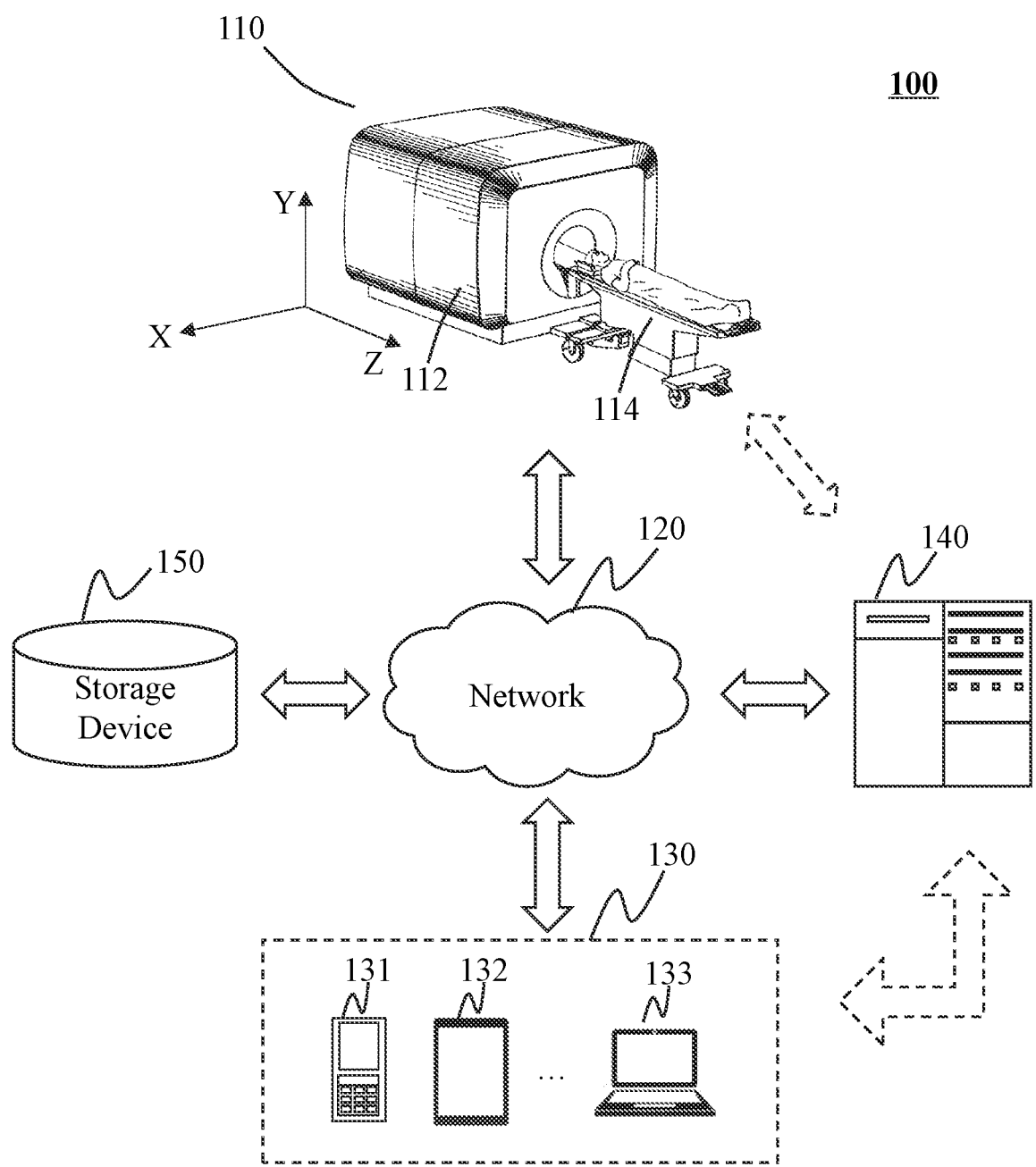
FIG. 1 is a schematic diagram illustrating an exemplary MRI system according to some embodiments of the present disclosure.

FIG. 1 is a schematic diagram illustrating an exemplary MRI system 100 according to some embodiments of the present disclosure. As illustrated, the MRI system 100 may include an MRI device 110, a network 120, a terminal 130, a processing device 140, and a storage device 150. The components of the MRI system 100 may be connected in one or more of various ways. Merely by way of example, as illustrated in FIG. 1, the MRI device 110 may be connected to the processing device 140 through the network 120. As another example, the MRI device 110 may be connected to the processing device 140 directly (as indicated by the bi-directional arrow in dotted lines linking the MRI device 110 and the processing device 140). As a further example, the storage device 150 may be connected to the processing device 140 directly or through the network 120. As still a further example, a terminal device (e.g., 131, 132, 133, etc.) may be connected to the processing device 140 directly (as indicated by the bi-directional arrow in dotted lines linking the terminal 130 and the processing device 140) or through the network 120.

The MRI device 110 may scan an object located within its detection region and generate a plurality of data relating to the object. In the present disclosure, "subject" and "object" are used interchangeably. Merely by way of example, the object may include a patient, a man-made object, etc. As another example, the object may include a specific portion, organ, and/or tissue of a patient. For example, the object may include the head, the brain, the neck, the body, a shoulder, an arm, the thorax, the heart, the stomach, a blood vessel, a soft tissue, a knee, a foot, or the like, or any combination thereof. In some embodiments, the MRI device 110 may be a close-bore scanner or an open-bore scanner.

In the present disclosure, the X axis, the Y axis, and the Z axis shown in FIG. 1 may form an orthogonal coordinate system. The X axis and the Z axis shown in FIG. 1 may be horizontal, and the Y axis may be vertical. As illustrated, the positive x-direction along the X axis may be from the right side to the left side of the MRI device 110 seen from the direction facing the front of the MRI device 110; the positive y-direction along the Y axis shown in FIG. 1 may be from the lower part to the upper part of the MRI device 110; the positive z-direction along the Z axis shown in FIG. 1 may refer to a direction in which the object is moved out of the detection region (or referred to as the bore) of the MRI device 110. More descriptions of the MRI device 110 may be found elsewhere in the present disclosure. See, e.g., FIG. 2 and the description thereof.

In some embodiments, the MRI device 110 may include a gantry 112 and a patient support 114 (e.g., along the z-direction). In some embodiments, the gantry 112 may be configured to support magnets (e.g., the main magnet 201 in FIG. 2), coils (e.g., the gradient coils 202 and/or the radio frequency (RF) coils 203 in FIG. 2), etc. The gantry 112 may surround, around the z-direction, the object that is moved into or located within the detection region. In some embodiments, the patient support 114 may be configured to support the object. In some embodiments, the patient support 114 may have 6 degrees of freedom, for example, three translational degrees of freedom along three coordinate directions (i.e., x-direction, y-direction, and z-direction) and three rotational degrees of freedom around the three coordinate directions. Accordingly, the object may be positioned by the patient support 114 within the detection region. Merely by way of example, the patient support 114 may move the object into the detection region along the z-direction in FIG. 1.

The network 120 may include any suitable network that can facilitate the exchange of information and/or data for the MRI system 100. In some embodiments, one or more components of the MRI system 100 (e.g., the MRI device 110, the terminal 130, the processing device 140, or the storage device 150) may communicate information and/or data with one or more other components of the MRI system 100 via the network 120. In some embodiments, the network 120 may be any type of wired or wireless network, or a combination thereof.

The terminal 130 may include a mobile device 131, a tablet computer 132, a laptop computer 133, or the like, or any combination thereof. In some embodiments, the mobile device 131 may include a smart home device, a wearable device, a smart mobile device, a virtual reality device, an augmented reality device, or the like, or any combination thereof. In some embodiments, the terminal 130 may remotely operate the MRI device 110 and/or the processing device 140. In some embodiments, the terminal 130 may operate the MRI device 110 and/or the processing device 140 via a wireless connection. In some embodiments, the terminal 130 may receive information and/or instructions inputted by a user, and send the received information and/or instructions to the MRI device 110 or to the processing device 140 via the network 120. In some embodiments, the terminal 130 may receive data and/or information from the processing device 140. In some embodiments, the terminal 130 may be part of the processing device 140. In some embodiments, the terminal 130 may be omitted.

Figure 2:
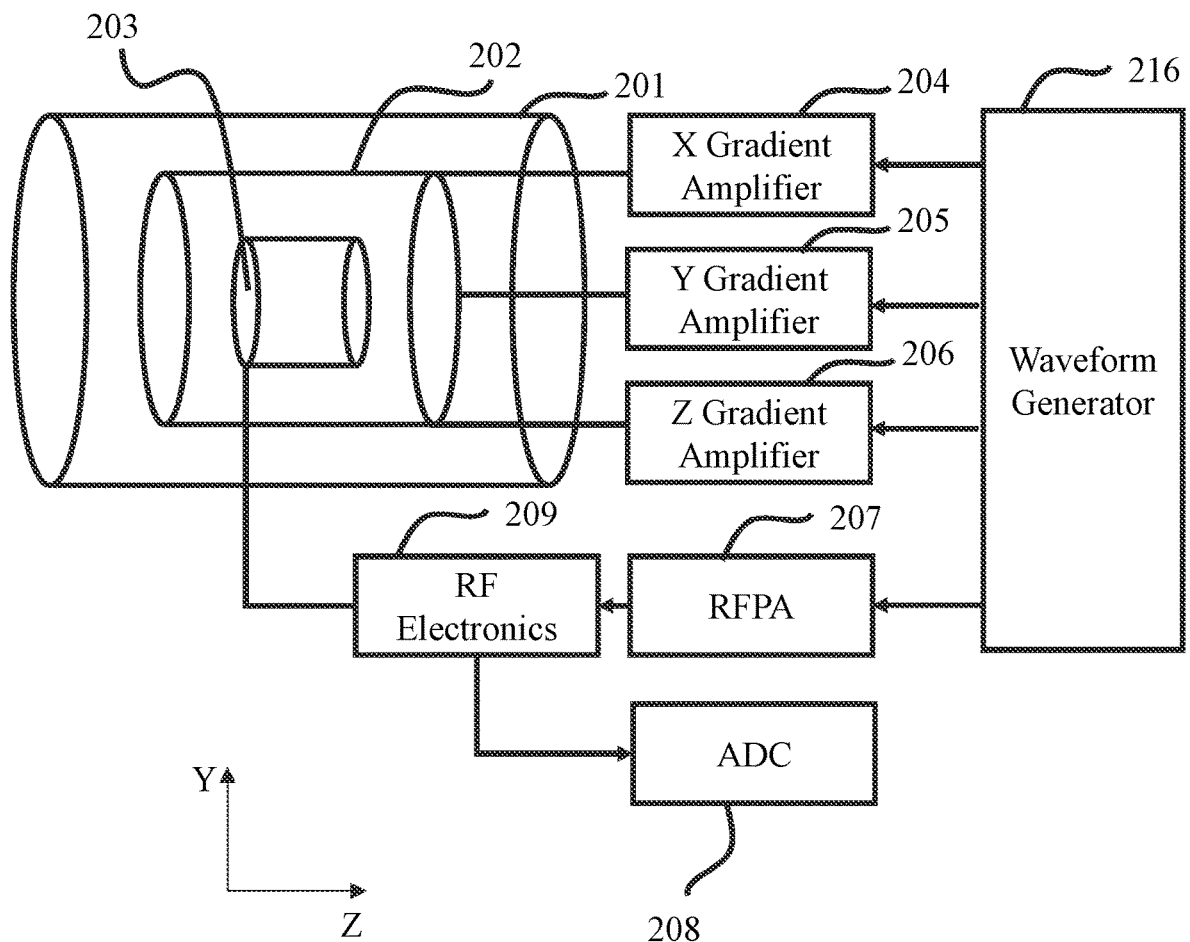
FIG. 2 is a schematic diagram illustrating an exemplary MRI device according to some embodiments of the present disclosure.

The processing device 140 may process data and/or information obtained from the MRI device 110, the terminal 130, and/or the storage device 150. For example, the processing device 140 may obtain an initial radio frequency signal to be amplified by an RFPA (e.g., an RFPA 207 as shown in FIG. 2) of the MRI device 110. The processing device 140 may generate a compensated radio frequency signal by performing, based on a preset compensation rule and a set of compensation parameters, a gain compensation operation for the initial radio frequency signal. The set of compensation parameters may include a supply voltage of the RFPA, a transistor junction temperature of the RFPA, an output power of the RFPA, or the like, or any combination thereof. The processing device 140 may generate, by performing a non-linear correction on the compensated radio frequency signal, a corrected radio frequency signal, which is transmitted to the RFPA. In some embodiments, the processing device 140 may be a single server, or a server group. The server group may be centralized or distributed. In some embodiments, the processing device 140 may be local or remote. In some embodiments, the processing device 140 may be implemented on a cloud platform. Merely by way of example, the cloud platform may include a private cloud, a public cloud, a hybrid cloud, a community cloud, a distributed cloud, an inter-cloud, a multi-cloud, or the like, or any combination thereof. In some embodiments, the processing device 140 may be implemented by a computing device 200 having one or more components as illustrated in FIG. 2.

The storage device 150 may store data and/or instructions. In some embodiments, the storage device 150 may store data obtained from the MRI device 110, the terminal 130 and/or the processing device 140. In some embodiments, the storage device 150 may store data and/or instructions that the processing device 140 may execute or use to perform exemplary methods described in the present disclosure. In some embodiments, the storage device 150 may include a mass storage device, a removable storage device, a volatile read-and-write memory, a read-only memory (ROM), or the like, or any combination thereof. In some embodiments, the storage device 150 may be implemented on a cloud platform.

In some embodiments, the storage device 150 may be connected to the network 120 to communicate with one or more components of the MRI system 100 (e.g., the MRI device 110, the processing device 140, the terminal 130, etc.). One or more components of the MRI system 100 may access the data or instructions stored in the storage device 150 via the network 120. In some embodiments, the storage device 150 may be part of the processing device 140.

FIG. 2 is a schematic diagram illustrating an exemplary MRI device according to some embodiments of the present disclosure. The magnetic resonance imaging (MRI) is a kind of tomography, which uses the magnetic resonance phenomenon to obtain electromagnetic signals from a human body to reconstruct human body information. The MRI device 110 may excite hydrogen nuclei in the human body by applying a radio frequency (RF) pulse of a specific frequency to the human body in a static magnetic field, causing the hydrogen nuclei to resonate and absorb energy. After stopping the RF pulse, the hydrogen nuclei may emit radio signals at a specific frequency and release the absorbed energy, which is collected by a receiver outside the human body and processed by an electronic computer (e.g., the processing device 140) to obtain an image, namely the magnetic resonance imaging. The magnetic resonance imaging completely gets rid of the damage caused by ionizing radiation to the human body, and has the outstanding characteristics of multiple parameters, large information, multidirectional imaging, high resolution to soft tissue, etc., which has been widely used in various fields, especially in medical diagnosis and research.

As illustrated, the MRI device 110 may include a main magnet 201 configured to generate a first magnetic field (or referred to as a main magnetic field) that may be applied to an object (also referred to as a subject) positioned inside the first magnetic field. The main magnet 201 may include a resistive magnet or a superconductive magnet that both need a power supply (not shown in FIG. 2) for operation. Alternatively, the main magnet 201 may include a permanent magnet. The main magnet 201 may form the detection region and surround, around the z-direction, the object that is moved into or positioned within the detection region. The main magnet 201 may also control the homogeneity of the generated main magnetic field. Some shim coils may be in the main magnet 201. The shim coils placed in the gap of the main magnet 201 may compensate for the inhomogeneity of the magnetic field of the main magnet 201. The shim coils may be energized by a shim power supply.

The MRI device 110 may include gradient coils 202 that are located inside the main magnet 201. For example, the gradient coils 202 may be located in the detection region. The gradient coils 202 may surround, around the z-direction, the object that is moved into or positioned within the detection region. The gradient coils 202 may be surrounded by the main magnet 201 around the z-direction, and be closer to the object than the main magnet 201. The gradient coils 202 may generate a second magnetic field (or referred to as a gradient field, including gradient fields Gx, Gy, and Gz). The second magnetic field may be superimposed on the main magnetic field generated by the main magnet 201 and distort the main magnetic field so that the magnetic orientations of the protons of an object may vary as a function of their positions inside the gradient field, thereby encoding spatial information into MR signals generated by the region of the object being imaged. The gradient coils 202 may include X coils (e.g., configured to generate the gradient field Gx corresponding to the x-direction), Y coils (e.g., configured to generate the gradient field Gy corresponding to the y-direction), and/or Z coils (e.g., configured to generate the gradient field Gz corresponding to the z-direction) (not shown in FIG. 2). The three sets of coils may generate three different magnetic fields that are used for position encoding. The gradient coils 202 may allow spatial encoding of MR signals for image reconstruction. As used herein, the X-axis, the Y-axis, the Z-axis, the x-direction, the y-direction, and the z-direction in the description of FIG. 2 are the same as or similar to those described in FIG. 1.

In some embodiments, the MRI device 110 may include radio frequency (RF) coils 203 that are located inside the main magnet 201 and serve as transmitters, receivers, or both. For example, the RF coils 203 may be located in the detection region. The RF coils 203 may surround, around the z-direction, the object that is moved into or positioned within the detection region. The RF coils 203 may be surrounded by the main magnet 201 and/or the gradient coils 202 around the z-direction, and be closer to the object than the gradient coils 202. The RF coils 203 may be a core component of the MRI device 110 for achieving the MRI examination. The RF coils 203 may be configured to emit an RF pulse, receive an MR signal, etc. The RF coils 203 may be in connection with RF electronics 209 that may be configured or used as one or more integrated circuits (ICs) functioning as a waveform transmitter and/or a waveform receiver. The RF electronics 209 may be connected to a radiofrequency power amplifier (RFPA) 207 and an analog-to-digital converter (ADC) 208. A pulse signal amplified by the RFPA 207 may be transmitted to the RF coils 203 for driving and/or controlling the RF coils 203 to generate an RF magnetic field, thereby generating RF excitation for imaging.

When used as transmitters, the RF coils 203 may generate RF signals that provide a third magnetic field that is utilized to generate MR signals related to the region of the object being imaged. The third magnetic field may be perpendicular to the main magnetic field. A waveform generator 216 may generate an RF pulse. The RF pulse may be amplified by an RFPA 207, processed by the RF electronics 209, and applied to the RF coils 203 to generate the RF signals in response to a powerful current generated by the RF electronics 209 based on the amplified RF pulse.

When used as receivers, the RF coils may be responsible for detecting MR signals (e.g., echoes). After excitation, the MR signals generated by the object may be sensed by the RF coils 203. The receive amplifier then may receive the sensed MR signals from the RF coils 203, amplify the sensed MR signals, and provide the amplified MR signals to the ADC 208. The ADC 208 may transform the MR signals from analog signals to digital signals. The digital MR signals then may be sent to the processing device 140 for sampling.

In some embodiments, the main magnet coil 201, the gradient coils 202, and the RF coils 203 may be circumferentially positioned with respect to the object around the z-direction. It is understood by those skilled in the art that the main magnet 201, the gradient coils 202, and the RF coils 203 may be situated in a variety of configurations around the object.

In some embodiments, the RFPA 207 may amplify an RF pulse (e.g., the power of the RF pulse, the voltage of the RF pulse) such that an amplified RF pulse is generated to drive the RF coils 203. The RFPA 207 may include a transistor-based RFPA, a vacuum tube-based RFPA, or the like, or any combination thereof. The transistor-based RFPA may include one or more transistors. The vacuum tube-based RFPA may include a triode, a tetrode, a klystron, or the like, or any combination thereof. In some embodiments, the RFPA 207 may include a linear RFPA or a non-linear RFPA. In some embodiments, the RFPA 207 may include one or more RFPAs. In some embodiments, the peak power of the RFPA 207 may be greater than 8 kilowatts (kW). For example, the peak power of the RFPA 207 may be 20 kW, 30 kW, 50 kW, etc. In some embodiments, the RFPA 207 may include multiple transistors that are connected in series and/or in parallel to generate sufficient power.

In some embodiments, the MRI device 110 may include one or more processing circuits (not shown) that are operably connected with the waveform generator 216 and the RFPA 207 for improving the output stability of the RFPA 207. For example, the one or more processing circuits may be set between the waveform generator 216 and the RFPA 207. The one or more processing circuits may include one or more hardware circuits such as an integrated circuit (e.g., an application-specific integrated circuit (ASIC), a field-programmable gate array (FPGA), etc.). The one or more processing circuits may be configured to perform gain compensation operation and non-liner correction operation for the RF pulse (also referred to as an initial RF signal) generated by the waveform generator 216 and transmit the processed RF pulse to the RFPA 207 for amplified, such that the RFPA 207 may achieve stable output. In some embodiments, the one or more processing circuits may be implemented as a processing module. Alternatively, the one or more processing circuits may be implemented as one or more processing modules. For example, the one or more processing circuits may be implemented as a gain compensation module and a non-linear correction module. The gain compensation module may be configured to generate a compensated RF pulse (also referred to as a compensated RF signal) by performing, based on a preset compensation rule and a set of compensation parameters, a gain compensation operation for the initial RF signal. The non-linear correction module may be configured to generate, by performing a non-linear correction operation on the compensated RF pulse (also referred to as a compensated RF signal), a corrected RF pulse (also referred to as a corrected RF signal). Alternatively, the waveform generator 216 may transmit the initial RF signal to at least one processor (e.g., the processing device 140) of the MRI system 100 for signal processing, and the RFPA 207 may receive the processed RF signal from the processor of the MRI system 100 for amplifying. For example, the waveform generator 216 may transmit the initial RF signal to the processing device 140. The processing device 140 may perform the gain compensation operation and the non-linear correction on/for the initial RF signal to generate the corrected RF signal, which is transmitted to the RFPA 207. The RFPA 207 may receive the corrected RF signal from the processing device 140. More descriptions regarding the gain compensation operation and the non-linear correction operation may be found elsewhere in the present disclosure (e.g., FIGS. 5-10 and relevant descriptions thereof).

FIG. 3 is a schematic diagram illustrating exemplary hardware and/or software components of a computing device on which the processing device 140 may be implemented according to some embodiments of the present disclosure. As illustrated in FIG. 3, the computing device 300 may include a processor 310, a storage 320, an input/output (I/O) 330, and a communication port 340.

The processor 310 may execute computer instructions (program code) and perform functions of the processing device 140 in accordance with techniques described herein. In some embodiments, the processor 310 may include a microcontroller, a microprocessor, a reduced instruction set computer (RISC), an application specific integrated circuits (ASICs), an application-specific instruction-set processor (ASIP), a central processing unit (CPU), a graphics processing unit (GPU), a physics processing unit (PPU), a microcontroller unit, a digital signal processor (DSP), a field programmable gate array (FPGA), an advanced RISC machine (ARM), a programmable logic device (PLD), any circuit or processor capable of executing one or more functions, or the like, or any combinations thereof.

Merely for illustration purposes, only one processor is described in the computing device 300. However, it should be noted that the computing device 300 in the present disclosure may also include multiple processors, and thus operations of a method that are performed by one processor as described in the present disclosure may also be jointly or separately performed by the multiple processors. For example, if in the present disclosure the processor of the computing device 300 executes both operations A and B, it should be understood that operations A and step B may also be performed by two different processors jointly or separately in the computing device 300 (e.g., a first processor executes operation A and a second processor executes operation B, or the first and second processors jointly execute operations A and B).

Merely by way example, the processor 310 may receive instructions to follow an MRI scan protocol for imaging/scanning the object. For example, the processor 310 may cause the patient support 114 of the MRI device 110 to move the object to a proper position within the bore of the MRI device 110. As another example, the processor 310 may also provide certain control signals to control the main magnet 201 to generate a main magnet field with a specific strength.

The processor 310 may receive control signals to set the shape, amplitude, and/or timing of the gradient waveforms and/or the RF waveforms, and send the set parameters to the waveform generator 216 to instruct the waveform generator 216 to generate a particular gradient waveform sequence and pulse sequence that are to be applied to the gradient coils 202 and the RF coils 203 through the amplifiers 204-207, respectively.

The processor 310 may also sample data (e.g., echoes) from the RF coils 203 based on one or more sampling parameters including, e.g., timing information (e.g., the length of data acquisition), the type of k-space data acquisition (e.g., undersampling, oversampling, etc.), sampling trajectory (e.g., Cartesian trajectory, non-Cartesian trajectory such as spiral trajectory, radial trajectory), or the like, or a combination thereof. In some embodiments, the timing information may be input by a user (e.g., an operator) or autonomously determined by the MRI system 100 based on one or more other parameters (e.g., clinical needs) of an imaging process. The timing information may correspond to the type of the gradient and RF waveforms that are sent to the gradient coils 202 and the RF coils 203, respectively, so that the MR signals are correctly sampled. The processor 310 may also generate an MR image by reconstructing the sampled data.

The storage 320 may store data/information obtained from the MRI device 110, the terminal 130, the storage device 150, or any other component of the MRI system 100. In some embodiments, the storage 320 may include a mass storage device, a removable storage device, a volatile read-and-write memory, a read-only memory (ROM), or the like, or any combination thereof. In some embodiments, the storage 320 may store one or more programs and/or instructions to perform exemplary methods described in the present disclosure. For example, the storage 320 may store a program for the processing device 140 for determining the corrected RF signal corresponding to the initial RF signal.

The I/O 330 may input or output signals, data, or information. In some embodiments, the I/O 330 may enable user interaction with the processing device 140. In some embodiments, the I/O 330 may include an input device and an output device. Exemplary input devices may include a keyboard, a mouse, a touch screen, a microphone, a trackball, or the like, or a combination thereof. Exemplary output devices may include a display device, a loudspeaker, a printer, a projector, or the like, or a combination thereof. Exemplary display devices may include a liquid crystal display (LCD), a light-emitting diode (LED)-based display, a flat panel display, a curved screen, a television device, a cathode ray tube (CRT), or the like, or a combination thereof.

The communication port 340 may be connected to a network (e.g., the network 120) to facilitate data communications. The communication port 340 may establish connections between the processing device 140 and the MRI device 110, the terminal 130, or the storage device 150. The connection may be a wired connection, a wireless connection, or a combination of both that enables data transmission and reception. In some embodiments, the communication port 340 may be a standardized communication port, such as RS232, RS485, etc. In some embodiments, the communication port 340 may be a specially designed communication port. For example, the communication port 340 may be designed in accordance with the digital imaging and communications in medicine (DICOM) protocol.

Figure 4:
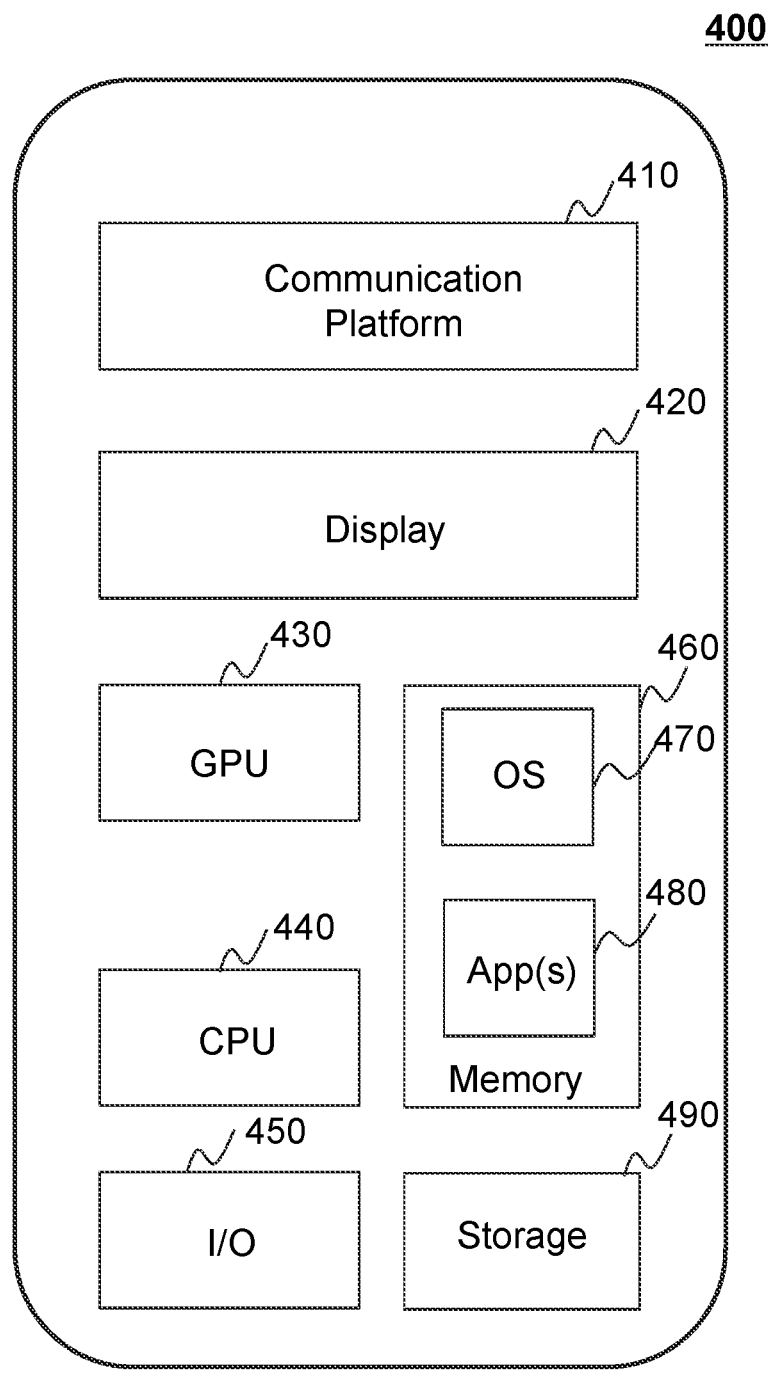
FIG. 4 is a schematic diagram illustrating hardware and/or software components of an exemplary mobile device according to some embodiments of the present disclosure.

FIG. 4 is a schematic diagram illustrating exemplary hardware and/or software components of a mobile device on which the terminal 130 may be implemented according to some embodiments of the present disclosure. As illustrated in FIG. 4, the mobile device 400 may include a communication platform 410, a display 420, a graphic processing unit (GPU) 430, a central processing unit (CPU) 440, an I/O 450, a memory 460, and a storage 490. In some embodiments, any other suitable component, including but not limited to a system bus or a controller (not shown), may also be included in the mobile device 400. In some embodiments, a mobile operating system 470 (e.g., iOS, Android, Windows Phone, etc.) and one or more applications 480 may be loaded into the memory 460 from the storage 490 in order to be executed by the CPU 440. The applications 480 may include a browser or any other suitable mobile apps for receiving and rendering information relating to signal processing or other information from the processing device 140. User interactions with the information stream may be achieved via the I/O 450 and provided to the processing device 140 and/or other components of the MRI system 100 via the network 120.

To implement various modules, units, and their functionalities described in the present disclosure, computer hardware platforms may be used as the hardware platform(s) for one or more of the elements described herein. The hardware elements, operating systems and programming languages of such computers are conventional in nature, and it is presumed that those skilled in the art are adequately familiar therewith to adapt those technologies to the blood pressure monitoring as described herein. A computer with user interface elements may be used to implement a personal computer (PC) or another type of work station or terminal device, although a computer may also act as a server if appropriately programmed. It is believed that those skilled in the art are familiar with the structure, programming and general operation of such computer equipment and as a result the drawings should be self-explanatory.

Figure 5:
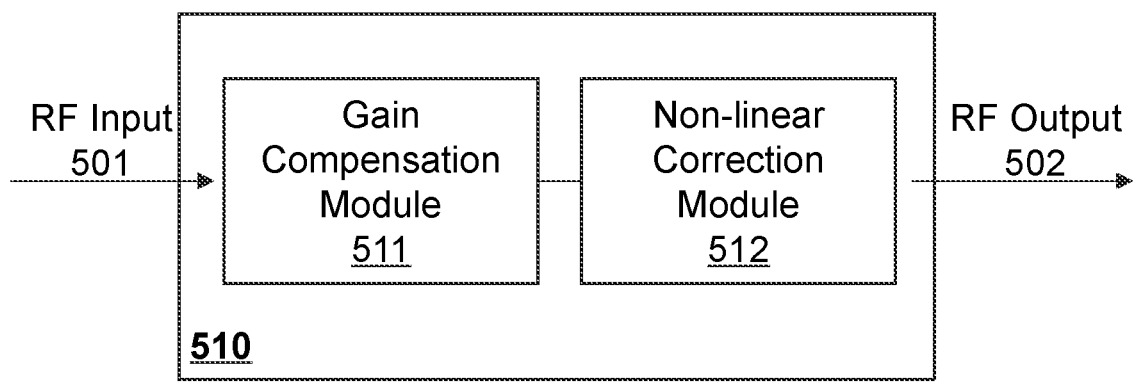
FIG. 5 is a schematic diagram illustrating an exemplary device for improving output stability of an RFPA according to some embodiments of the present disclosure.

FIG. 5 is a schematic diagram illustrating an exemplary device for improving output stability of an RFPA according to some embodiments of the present disclosure. As shown in FIG. 5, the device 510 for improving output stability of an RFPA (e.g., the RFPA 207) may include a gain compensation module 511, a non-liner correction module 512, or the like, or any combination thereof. As used herein, the gain compensation module 511 and the non-liner correction module 512 may be implemented by one or more processing circuits that are operably connected with the RFPA. For example, the gain compensation module 511 may be implemented by a first processing circuit, and the non-linear correction module 512 may be implemented by a second processing circuit. The first processing circuit and/or the second processing circuit may include an integrated circuit (e.g., an application-specific integrated circuit (ASIC), a field-programmable gate array (FPGA), etc.).

Figure 6:
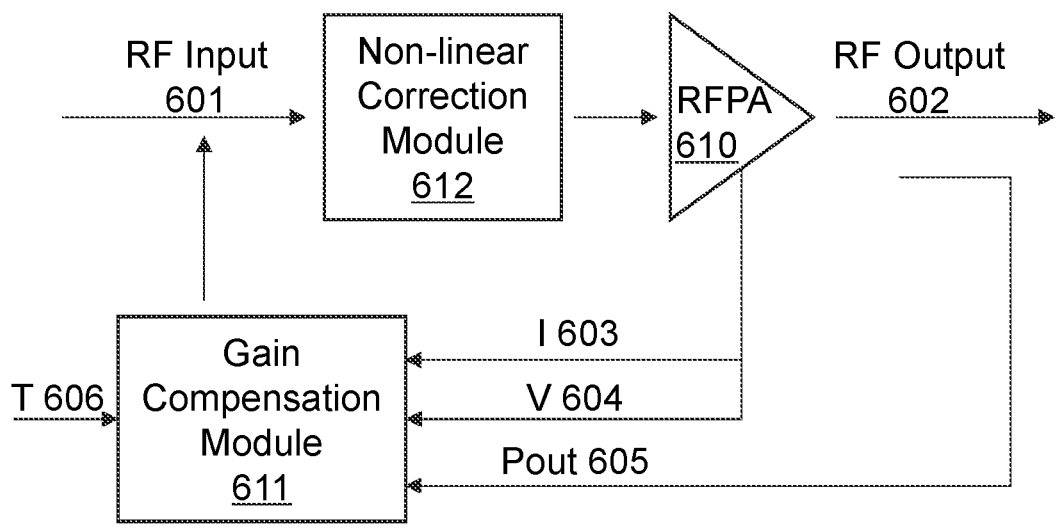
FIG. 6 is a schematic diagram illustrating an exemplary connection between a device for improving output stability of an RFPA and the RFPA according to some embodiments of the present disclosure.

In some embodiments, the device 510 may be set at an input interface of the RFPA (e.g., be set between the RFPA 207 and the waveform generator 216). For example, as shown in FIG. 6, the gain compensation module 511 and the non-linear correction module 512 may be set at an input interface of an RFPA 610. Alternatively, the device 510 may be integrated with the RFPA (e.g., the RFPA) as a part of the RFPA. It should be noted that the relative position between the device 510 and the RFPA is not limited herein. For example, a portion (e.g., the non-liner correction module 512) of the device 510 may be integrated with the RFPA and another portion (e.g., the gain compensation module 511) of the device 510 may be separately set with the RFPA. As another example, the gain compensation module 511 may be operably connected with the RFPA and the non-linear correction module 512 respectively. As still another example, the non-linear correction module 512 may be operably connected with the RFPA and the gain module 511 respectively.

The gain compensation module 511 may be configured to perform a gain compensation operation for an RF signal to be amplified by the RFPA (e.g., the RFPA 207). In some embodiments, the gain compensation module 511 may include a programmable gain amplifier. The programmable gain amplifier may obtain an RF input 501 (e.g., from the waveform generator 216). The programmable gain amplifier may generate a compensated RF signal by performing, based on a preset compensation rule and a set of compensation parameters, a gain compensation operation for the RF input 501. The RF input 501 may refer to an initial RF signal (e.g., an initial RF pulse) to be amplified by the RFPA. For example, the RF input 501 may be a pulse signal (e.g., a pulse modulated signal). As another example, the frequency of the RF input 501 may be in a range from 10 megahertz to 1000 megahertz (i.e., 10 MHz-1000 MHz), e.g., 30 MHz, 90 MHz, 120 MHz, 300 MHz, 500 MHz, 720 MHz, etc. The set of compensation parameters may include a supply voltage of the RFPA, a transistor junction temperature of the RFPA, an output power of the RFPA, or the like, or any combination thereof. The preset compensation rule may include a series of mappings between a gain compensation quantity and the set of compensation parameters. In some embodiments, the gain compensation module 511 may directly transmit the compensated RF signal to the RFPA for amplification. For example, the gain compensation module 511 may directly transmit the compensated RF signal to the input interface of the RFPA. Alternatively, the gain compensation module 511 may transmit the compensated RF signal to the non-linear correction module 512 for non-linear correction and the corrected RF signal may further be transmitted to the RFPA for amplification. More descriptions regarding the gain compensation operation may be found elsewhere in the present disclosure (e.g., FIG. 6 and relevant descriptions thereof.

The non-linear correction module 512 may be configured to perform a non-linear correction operation on an RF signal to be amplified by the RFPA. For example, the non-linear correction module 512 may adjust the initial RF signal to be amplified by the RFPA (e.g., the RF input 501) to determine a corrected RF signal that is transmitted to the RFPA. As another example, the non-linear correction module 512 may adjust the compensated RF signal generated by the gain compensation module 511 to generate a corrected RF signal (e.g., an RF output 502) that is transmitted to the RFPA. In some embodiments, the non-linear correction module 512 may be achieved by a predistortion scheme, a feedback scheme, etc. Generally, to achieve high image quality, the MRI system 100 or the MRI device 110 is needed to have a desired linearity of radio frequency over a large dynamic range. However, the RFPA may be a non-linear device whose output signal has large non-linear distortion. According to some embodiments of the present disclosure, the non-linear correction module 512 and the RFPA may form a linear amplification system, such that the input signal and the output signal of the RFPA can keep a linear relation, thereby avoiding or reducing the non-linear distortion.

It should be noted that the above description regarding the device 510 is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. In some embodiments, the device 510 may not include the non-linear correction module 512. In some embodiments, the device 510 may include one or more additional components. In some embodiments, functions of the first processing circuit and the second processing circuit may be implemented by a same processing circuit.

FIG. 6 is a schematic diagram illustrating an exemplary connection between a device for improving output stability of an RFPA and the RFPA according to some embodiments of the present disclosure. As shown in FIG. 6, the device for improving output stability of the RFPA 610 may include a gain compensation module 611 and a non-linear correction module 612. The non-linear correction module 612 may be connected with the gain compensation module 611 and the RFPA 610 separately.

As described in connection with FIG. 2, the RFPA 610 is a core component of an MRI device (e.g., the MRI device 110). The MRI device requires optimum performance of the RFPA 610, and the instantaneous power of the RFPA 610 may reach a power greater than 10 kW. Usually, the RFPA 610 includes multiple transistors (e.g., metal-oxide-semiconductor field-effect transistors (MOSFETs)) that are connected in series and/or in parallel to generate sufficient power. The RFPA needs to ensure stable gain to achieve desired imaging effects of the MRI device. As a gain of a MOSFET is non-linear, the gain of the RFPA 610 needs to be compensated to ensure the gain stability of the RFPA 610.

Figure 7:
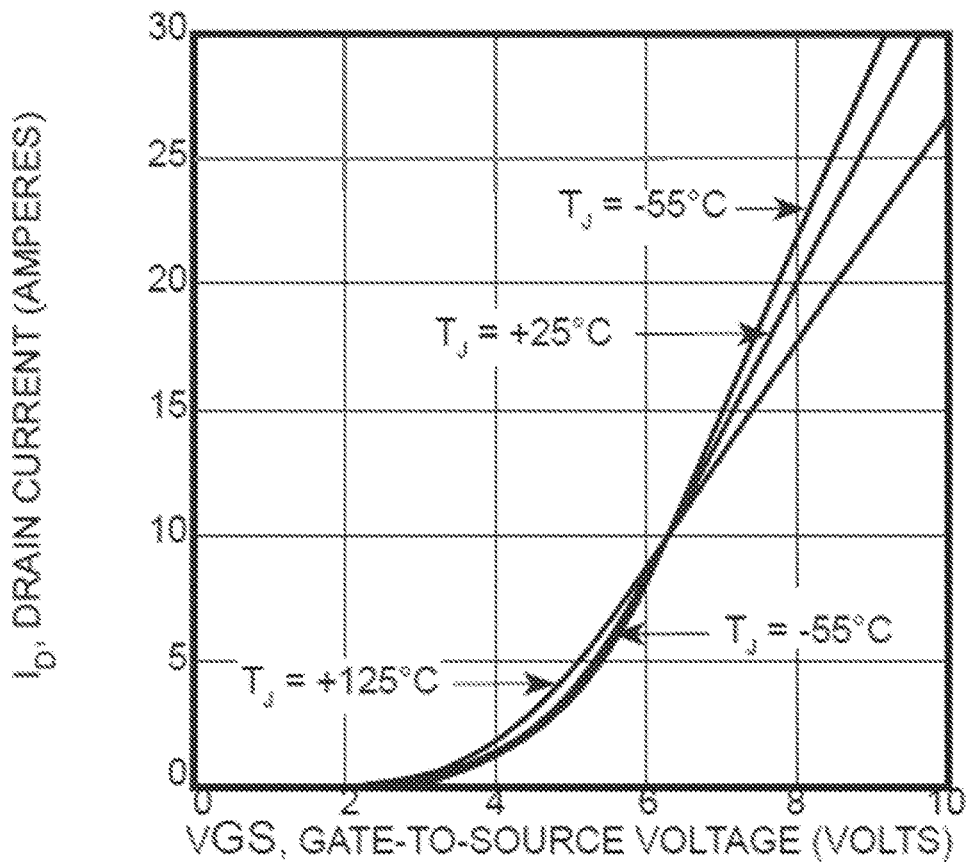
FIG. 7 is a schematic diagram illustrating an exemplary transmission characteristic curve of a MOSFET according to some embodiments of the present disclosure.

FIG. 7 is a schematic diagram illustrating an exemplary transmission characteristic curve of a MOSFET according to some embodiments of the present disclosure. Data in the transmission characteristic curve of the MOSFET was detected in a preset detection condition that is determined by a manufacture of the MOSFET. As shown in FIG. 7, the horizontal axis of the transmission characteristic curve denotes a gate-to-source voltage (i.e., Vgs) of the MOSFET, and the vertical axis of the transmission characteristic curve denotes a drain current (also referred to as a supply current) of the MOSFET. A unit of the gate-to-source voltage of the MOSFET is volt (V). A unit of the drain current of the MOSFET is ampere (A). The Vgs of the MOSFET may reflect an input power of the MOSFET. For example, the higher the Vgs of the MOSFET is, the higher the input power of the MOSFET can be. The drain current of the MOSFET may reflect an output power of the MOSFET. For example, the drain current of the MOSFET may be positively correlated and non-linear with the output power of the MOSFET. The higher the drain current of the MOSFET is, the higher the output power of the MOSFET can be. FIG. 7 illustrates relations between the Vgs of the MOSFET and the drain current of the MOSFET when the MOSFET is under different temperatures ($T_j$). A unit of the temperature is degree Celsius (° C.). As shown in FIG. 7, curves relating to the Vgs of the MOSFET and the drain current of the MOSFET are different when the MOSFET is at different temperatures. Accordingly, the input power of the MOSFET and the output power of the MOSFET may demonstrate different relations when the MOSFET is at different temperatures, indicating that the temperature may affect the relationship between the input power of the MOSFET and the output power of the MOSFET (i.e., affect the gain of the MOSFET). In addition, FIG. 7 shows that when the Vgs of the MOSFET is lower than a certain volt or the drain current of the MOSFET is lower than a certain ampere, the drain current of the MOSFET is positively correlated to the temperature of the MOSFET, which indicates that when the input power of the MOSFET is lower than a certain input power or the output power of the MOSFET is lower than a certain output power, the output power of the MOSFET may be positively correlated to the temperature of the MOSFET. FIG. 7 also shows that when the Vgs of the MOSFET is higher than the certain volt or the drain current of the MOSFET is higher than the certain ampere, the drain current of the MOSFET is negatively correlated to the temperature of the MOSFET, which indicates that when the input power of the MOSFET is higher than the certain input power or the output power of the MOSFET is higher than the certain output power, the output power of the MOSFET may be negatively correlated to the temperature of the MOSFET. In some embodiments, the temperature of the MOSFET used herein may refer to a junction temperature of the MOSFET. As used herein, the junction temperature refers to an actual maximum temperature of a semiconductor in an electronic device, which is usually higher than the surface temperature of the semiconductor. In some embodiments, the RFPA 610 may include a transistor junction temperature. The transistor junction temperature of the RFPA 610 may reflect the junction temperature of one or more transistors in the RFPA 610. The transistor junction temperature of the RFPA 610 may be related to an ambient temperature, a pulse amplitude of the RFPA 610, a duty cycle of the RFPA 610, or the like, or any combination thereof. The duty cycle refers to the fraction of one period in which a signal or system (e.g., an output signal of the RFPA 610 or the RFPA 610) is active. The duty cycle may be expressed as a ratio or a percentage. For example, a 60% duty cycle refers a signal is on 60% of the time but off 40% of the time. Under the same heat dissipation condition, the higher the ambient temperature, the pulse amplitude, and/or the duty cycle, the higher the junction temperature may be. When the transistor junction temperature of the RFPA 610 rises or increases, the gain of the RFPA 610 may change, further affecting the reliability and stability of the MRI device including the RFPA 610. Thus, not only the temperature (e.g., the transistor junction temperature) but also the power (e.g., the input and/or output power) of the MOSFET may affect the gain of the MOSFET, i.e., affect the gain of RFPA 610. In some embodiments, when the MOSFET operates under different frequencies (e.g., in a bandwidth range from 10 MHz to 1000 MHz), the MOSFET may correspond to different gains. According, the frequency of the RF signal to be amplified by the RFPA 610 may affect the gain of the RFPA 610.

Figure 8:
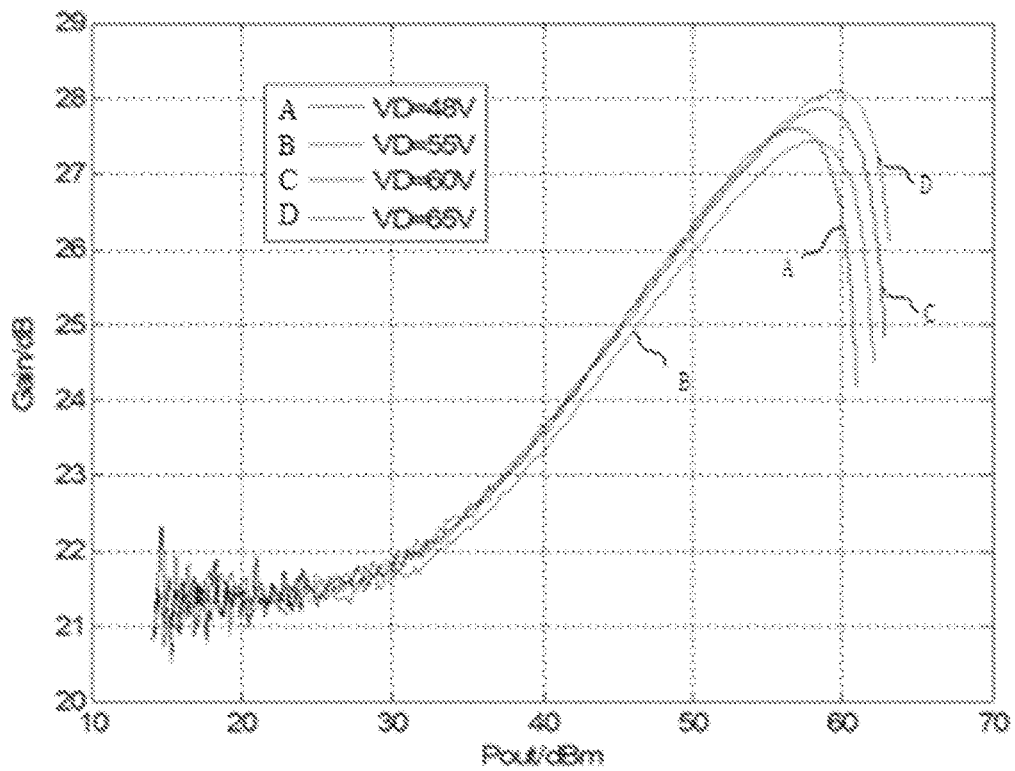
FIG. 8 is a schematic diagram illustrating exemplary gain curves of an RFPA according to some embodiments of the present disclosure.

FIG. 8 is a schematic diagram illustrating exemplary gain curves of an RFPA according to some embodiments of the present disclosure. As shown in FIG. 8, when a supply voltage of the RFPA 610 is 48 V, the gain curve of the RFPA 610 corresponds to curve A. When the supply voltage of the RFPA 610 is 55 V, the gain curve of the RFPA 610 corresponds to curve B. When the supply voltage of the RFPA 610 is 60 V, the gain curve of the RFPA 610 corresponds to curve C. When the supply voltage of the RFPA 610 is 65 V, the gain curve of the RFPA 610 corresponds to curve D. FIG. 8 shows that the gain curves of the RFPA 610 are not consistent when the RFPA 610 is at different supply voltages. Thus, the supply voltage of the RFPA 610 may affect the gain of the RFPA.

According to the descriptions of FIGS. 7 and 8, the temperature, the power, and the supply voltage of the RFPA 610 may cause gain fluctuation of the RFPA 610, which may need to be compensated to ensure gain stability of the RFPA 610. However, the general non-linear correction schemes may not compensate for the gain fluctuation or not reach desired compensation effect, resulting in an unstable output of the RFPA. Accordingly, before an RF input 601 is transmitted to the RFPA 610, the gain compensation module 611 may generate a compensated RF signal by performing, based on a preset compensation rule and a set of compensation parameters, a gain compensation operation for the RF input 601, which can improve output stability of the RFPA 610. The RF input 601 may be an initial RF signal to be amplified by the RFPA 610, which is similar to the RF input 501 as described in FIG. 5. The set of compensation parameters may include a supply voltage (denoted by V 604) of the RFPA 610, the transistor junction temperature (denoted by T 606) of the RFPA 610, the power (e.g., the output power denoted by Pout 605) of the RFPA 610, a drain current (e.g., denoted by I 603) of the RFPA 610, a frequency of the RF input 601 of the RFPA 610, or the like, or any combination thereof. As used herein, the supply voltage of the RFPA 610 refers to a voltage of the RFPA 610. The transistor junction temperature of the RFPA 610 is designated to be a sum of an ambient temperature and a transistor junction temperature rise of the RFPA 610. The power of the RFPA 610 may include the input power and/or the output power of the RFPA. The preset compensation rule may include a gain compensation table, a gain compensation function, a gain compensation model (e.g., a machine learning model), etc., that reflect a series of mapping relationships between a gain compensation quantity of the RFPA 610 and the set of compensation parameters. As used herein, the gain of the RFPA 610 may refer to a difference between the input power and the output power, and the gain compensation quantity of the RFPA 610 may refer to a difference between the gain of the RFPA 610 and a desired gain. Different supply voltages, different transistor junction temperatures, and different output powers may correspond to different gain compensation quantities. The gain compensation table may list the series of mapping relationships between the gain compensation quantity of the RFPA 610 and the set of compensation parameters. The gain compensation function may include one or more polynomials that incorporate the gain compensation quantity and the set of compensation parameters. The gain compensation model may be configured to output the gain compensation quantity of the RFPA 610 based on an input of the set of compensation parameters. For example, the gain compensation module 611 may determine a gain compensation quantity based on the preset compensation rule and the set of compensation parameters. The gain compensation module 611 may generate the compensated RF signal based on the gain compensation quantity and the RF input 601.

In some embodiments, the series of mapping relationships between the gain compensation quantity of the RFPA 610 and the set of compensation parameters may be pre-determined based on experimental results and/or simulation results. For example, multiple gain curves when the RFPA 610 is at different sets of compensation parameters may be tested or simulated to determine different gain compensation quantities corresponding to the different sets of compensation parameters. In some embodiments, a gain compensation quantity corresponding to a specific set of compensation parameters may be determined based on an power (e.g., an input power and an output power) of the RFPA 610 when the RFPA 610 is under the specific set of compensation parameters. For example, a gain of the RFPA 610 may be determined by the output power of the RFPA 610 minus the input power of the RFPA 610. The gain compensation quantity of the RFPA 610 may be determined based on the gain of the RFPA 610 and a desired gain (i.e., a constant gain under different sets of compensation parameters). For example, the gain compensation quantity of the RFPA 610 may be determined by the desired gain minus the gain of the RFPA 610. Then, the gain compensation table may be determined (or established) based on the different gain compensation quantities corresponding to the different sets of compensation parameters. Then, the gain compensation module 611 may retrieve and query the gain compensation table based on the set of compensation parameters to determine the gain compensation quality corresponding to the set of compensation parameters for compensating the RF input 601. As another example, the series of mapping relationships between the gain compensation quantity and the set of compensation parameters are determined by data fitting, based on a function (e.g., the gain compensation function) that incorporates the gain compensation quantity and the set of compensation parameters. Similar to the determination of the gain compensation table, multiple gain curves when the RFPA 610 is at different sets of compensation parameters may be tested or simulated to determine different gain compensation quantities corresponding to the different sets of compensation parameters. The gain compensation function that incorporates the gain compensation quantity and the set of compensation parameters may be determined (e.g., fitted) based on the different gain compensation quantities corresponding to the different sets of compensation parameters. Then, the gain compensation module 611 may retrieve the gain compensation function and calculate the gain compensation quantity based on the set of compensation parameters for compensating the RF input 601.

In some embodiments, the gain compensation module 611 may determine a first compensation quantity based on the supply voltage of the RFPA 610 and the output power of the RFPA 610. For instance, first gain quantities may be tested/detected at different supply voltages of the RFPA 610 when the temperature (e.g., the ambient temperature) keeps constant or not changed, which is similar to FIG. 8. The more the gain curves are tested, the more accurate the gain compensation quantity may de determined. A first compensation function may be determined by data fitting based on the first gain quantities corresponding to the different voltages. The first compensation function may be denoted as $\delta1=f(v, Pout)$. $\delta1$ denotes a first gain quantity of the RFPA 610, v denotes a supply voltage of the RFPA 610, and Pout denotes an output power of the RFPA 610. In some embodiments, to improve fitting accuracy, the first compensation function may be fitted out using subsection fitting and include multiple segments. For example, when Pout is equal to or less than a first power (denoted by P1), the first gain quantity may be designated to be 0 (i.e., Pout≤P1, $\delta1=0$). When Pout is greater than the first power and equal to or less than a second power (denoted by P2), the first gain quantity may be designated to be $0.0024*(159-v)*(Pout-65.7)$ (i.e., P1<Pout≤P2, $\delta1=0.0024*(159-v)*(Pout-65.7)$). When Pout is greater than the second power, the first gain quantity may be designated to be $0.0121*(159-v)*(Pout-0.066*v-59.28)+0.013*(159-v)*(0.036*v-4.23)$ (i.e., P2<Pout, $\delta1=0.0121*(159-v)*(Pout-0.066*v-59.28)+0.013*(159-v)*(0.036*v-4.23)$). Then, the gain compensation module 611 may determine the first gain quantity based on the first compensation function, the supply voltage 604 of the RFPA 610, and the output power 605 and designate the first gain quantity as the first compensation quantity.

In some embodiments, the gain compensation module 611 may determine a second compensation quantity based on the output power of the RFPA 610 and the transistor junction temperature of the RFPA 610. For instance, second gain quantities may be tested/detected at different junction temperatures of the transistor in the RFPA 610 when the supply voltage keeps constant or does not changed. A second compensation function may be determined by data fitting based on the second gain quantities corresponding to the different junction temperatures. The second compensation function may be denoted as $\delta2=f(T_j, Pout)$. $\delta2$ denotes a second gain quantity of the RFPA 610, $T_j$ denotes a transistor junction temperature of the RFPA 610, and Pout denotes the output power of the RFPA 610. A mapping relationship between the second gain quantity and the junction temperature and the output power may be designated as Equation (1) as follows:

$$\delta2=-0.98-0.52*Tj+0.66*Pout+0.1*Tj^2+0.21*Tj*Pout-0.06*Pout^2-0.09*Tj^2*Pout. \quad (1)$$

Then, the gain compensation module 611 may determine the second gain quantity based on the second compensation function, the junction temperature 606 of the transistor in the RFPA 610, and the output power 605 and designate the second gain quantity as the first compensation quantity. Further, the gain compensation module 611 may determine the gain compensation quantity based on the first compensation quantity and the second compensation quantity. For example, the gain compensation module 611 may designate a sum of the first compensation quantity and the second compensation quantity as the gain compensation quantity (i.e., $\delta1+\delta2$) for generating the compensated RF signal. As another example, the gain compensation module 611 may designate a product of the first compensation quantity and the second compensation quantity as the gain compensation quantity (i.e., $\delta1*\delta2$) for generating the compensated RF signal.

The non-linear correction module 612 may generate a corrected RF signal by performing a non-linear correction operation on the compensated RF signal and transmitting the corrected RF signal to the RFPA 610. The non-linear correction module 612 may be the same as or similar to the non-linear correction module 512. The compensated RF signal may be similar to the RF output 502. Further, the RFPA 610 may amplify the corrected RF signal to generate an RF output 602. The RF output 602 may be an amplified RF pulse that is transmitted to RF coils of the MRI device (e.g., the RF coils 203 of the MRI device 110) for driving and/or controlling the RF coils to generate an RF magnetic field for imaging.

According to some embodiments of the present disclosure, the gain compensation module 611 may cooperate with the non-linear correction module 612 to form the device for improving output stability of the RFPA 610. The gain compensation module 611 may compensate for the RF input 601 based on the preset compensation rule and the set of compensation parameters, such that the output power fluctuation of the RFPA 610 that is caused by the set of compensation parameters may be compensated and improved, thereby achieving a stable output of the RFPA 610 in different operating situations and improving the compensation effect for the RFPA 610.

It should be noted that the above description regarding the process 700 is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. In some embodiments, the non-linear correction module 612 may be omitted. The compensated RF signal may be directly transmitted to the RFPA 610 for amplification.

Figure 9:
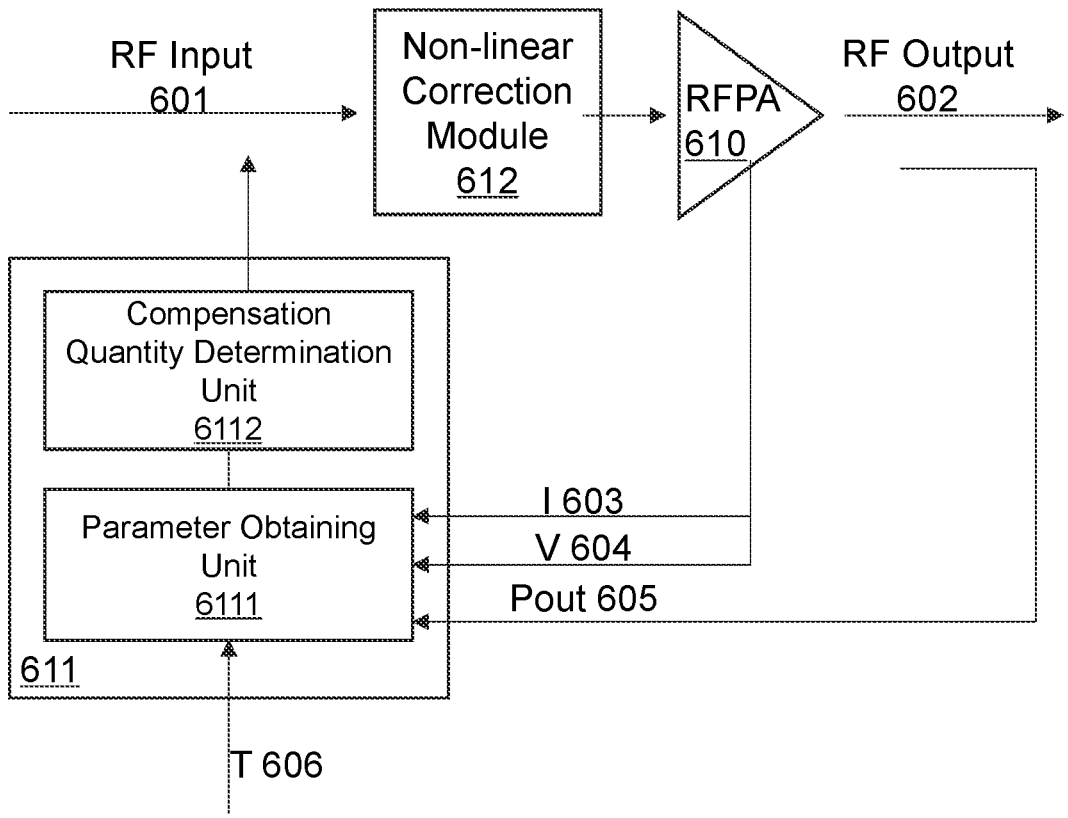
FIG. 9 is a schematic diagram illustrating an exemplary connection between a device for improving output stability of an RFPA and the RFPA according to some embodiments of the present disclosure.

In some embodiments, the gain compensation module 611 may be divided into two or more units for implementing functions of the gain compensation module 611. Merely by way of example, as shown in FIG. 9, the gain compensation module 611 may include a parameter obtaining unit (also referred to as a signal collection unit) 6111 and a compensation quantity determination unit 6112. The parameter obtaining unit 6111 may be operably connected with the compensation quantity determination unit 6112

The parameter obtaining unit 6111 may be configured to obtain the set of parameters. For example, the parameter obtaining unit 6111 may include a supply voltage obtaining sub-unit configured to obtain or collect the supply voltage (e.g., V 604) of the RFPA 610. The supply voltage obtaining sub-unit may obtain the supply voltage of the RFPA 610 by an analog to digital converter (ADC). As another example, the parameter obtaining unit 6111 may include a power obtaining sub-unit configured to obtain the power of the RFPA 610. The power of the RFPA 610 may include the input power and/or the output power of the RFPA 610. The power obtaining sub-unit may include a power detection unit such as an RF detection chip AD8310. Alternatively, the power obtaining sub-unit may determine (e.g., calculate) the power of the RFPA 610 based on the supply voltage and/or the drain current (e.g., I 603) of the RFPA 610 that are detected by the ADC (e.g., by performing digital signal processing on the supply voltage and/or the drain current (e.g., I 603) of the RFPA 610 that are detected by the ADC).

As still another example, the parameter obtaining unit 6111 may include a temperature obtaining sub-unit. The temperature obtaining sub-unit may be configured to obtain the ambient temperature of the RFPA 610 that is detected by e.g., a temperature and humidity sensor. The temperature obtaining sub-unit may also be configured to determine the transistor junction temperature of the RFPA 610 based on the ambient temperature and a transistor junction temperature rise of the RFPA 610. The transistor junction temperature rise of the RFPA 610 may be detected by a temperature sensor (e.g., the temperature and humidity sensor). Alternatively, the temperature obtaining sub-unit may determine (e.g., calculate) the transistor junction temperature rise based on a power dissipation of the RFPA 610 and an equivalent thermal resistance of the RFPA 610. For example, the temperature obtaining sub-unit may determine the power dissipation of the RFPA 610 based on the output power (e.g., Pout 605) of the RFPA 610, the supply voltage (e.g., V 604) of the RFPA 610, and the drain current (e.g., 1603) of the RFPA 610 according to Equation (2) as follows:

$$P\text{loss} = V\text{in} * I\text{in} - P\text{out}, \quad (2)$$

where Ploss denotes the power dissipation of the RFPA 610 a unit of which is w, Vin denotes the supply voltage of the RFPA 610 a unit of which is v, Iin denotes the drain current of the RFPA 610 a unit of which is A, and Pout denotes the output power of the RFPA 610 a unit of which is w. Further, the temperature obtaining sub-unit may determine the junction temperature rise of the transistor in the RFPA 610 based on the power dissipation of the RFPA 610 according to Equation (3) as follows:

$$\Delta T = R * P\text{loss}, \quad (3)$$

where $\Delta T$ denotes the junction temperature rise of the transistor in the RFPA 610, and R denotes the equivalent thermal resistance of the RFPA 610 a unit of which is ohm ($\Omega$). Further, the temperature obtaining sub-unit may determine a sum of the ambient temperature and the junction temperature rise as the transistor junction temperature of the RFPA 610. It should be noted that the transistor junction temperature of the RFPA 610 may be determined based on any other manner (e.g., a thermoelectric parameter manner and an electrothermal coupling model junction temperature measurement manner, etc.).

Figure 10:
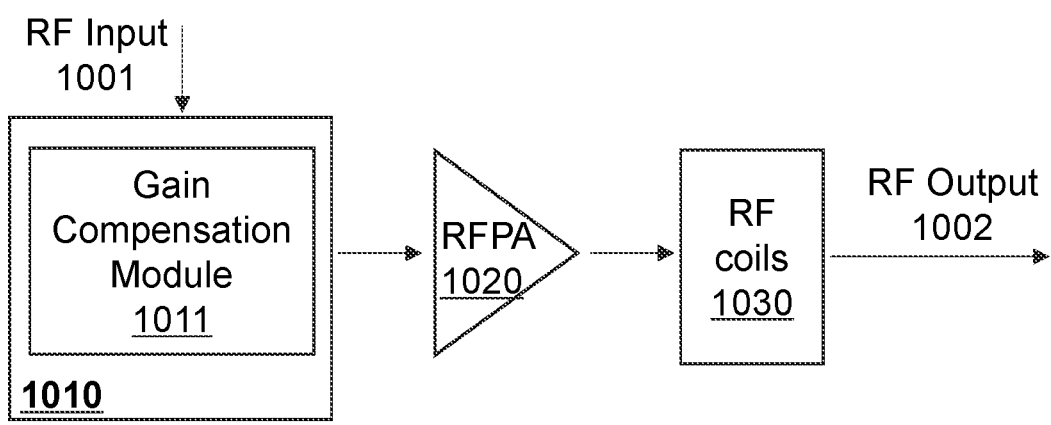
FIG. 10 is a schematic diagram illustrating an exemplary RF system according to some embodiments of the present disclosure.

FIG. 10 is a schematic diagram illustrating an exemplary RF system according to some embodiments of the present disclosure. As shown, the RF system may include a device 1010 for improving output stability of an RFPA 1020, the RFPA 1020, RF coils 1030, or the like, or any combination thereof. The RFPA 1020 may be connected with the device 1010 and the RF coils 1030. The device 1010 may be the same as or similar to the device 510. The device 1010 may include a gain compensation module 1011, which is similar to the gain compensation 511 and the gain compensation module 611. An RF input 1001 may be compensated by the device 1010 and transmitted to the RFPA 1020. The RFPA 1020 may amplify the compensated RF signal and transmit the amplified RF signal to the RF coils 1030. The RF coils 1030 may be driven by the amplified RF signal to generate an RF magnetic field (i.e., an RF output 1002) for imaging. By connecting the RFPA 1020 with the device 1010, the RFPA 1020 may achieve stable output in different operating situations.

Figure 11:
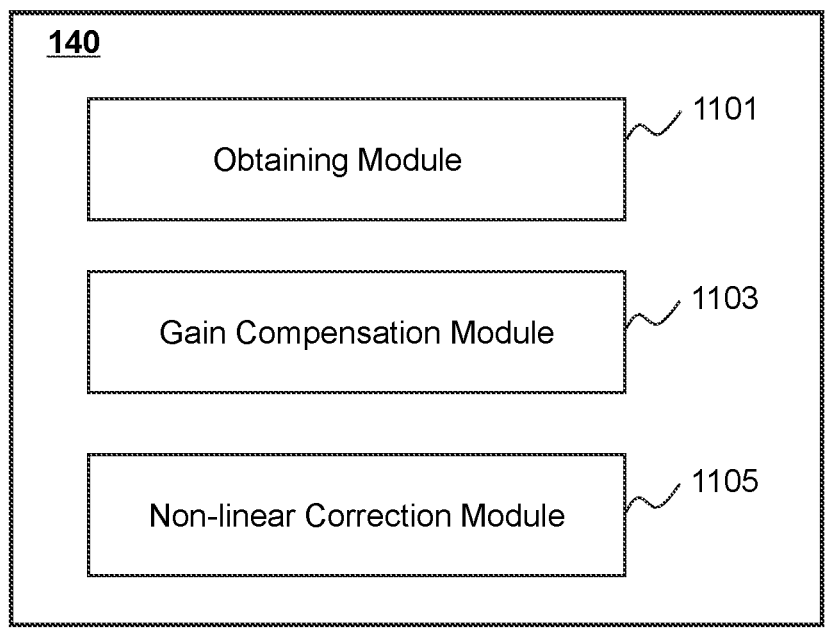
FIG. 11 a block diagram illustrating an exemplary processing device according to some embodiments of the present disclosure.

FIG. 11 is a block diagram illustrating an exemplary processing device according to some embodiments of the present disclosure. As described in connection with FIG. 2, the processing device 140 may be operably connected with the waveform generator 216 and the RFPA 207 for gain compensation and/or non-liner correction of an RF signal. As shown in FIG. 11, the processing device 140 may include an obtaining module 1101, a gain compensation module 1103, a non-linear correction module 1105, etc.

The obtaining module 1101 may be configured to obtain an initial RF signal to be amplified by the RFPA 207. For example, the initial RF signal may be generated by the waveform generator 216, and the obtaining module 1101 may obtain the initial RF signal from the waveform generator 216. In some embodiments, the initial RF signal may be the same as or similar to the RF input 501, the RF input 601, or the RF input 1001, which is not repeated herein.

The gain compensation module 1103 may be configured to compensate for the initial RF signal. For example, the gain compensation module 1103 may generate a compensated RF signal by performing, based on a preset compensation rule and a set of compensation parameters, a gain compensation operation for the initial RF signal. The preset compensation rule may include a series of mappings between a gain compensation quantity and the set of compensation parameters. The set of compensation parameters may include a supply voltage of the RFPA 207, a transistor junction temperature of the RFPA 207, an output power of the RFPA 207, or the like, or any combination thereof. More descriptions regarding the gain compensation operation may be found elsewhere in the present disclosure (e.g., FIG. 6 and relevant descriptions thereof).

The non-linear correction module 1005 may be configured to correct the initial RF signal or the compensated RF signal. For example, the non-linear correction module 1005 may generate, by performing a non-linear correction operation on the compensated RF signal, a corrected RF signal, which is transmitted to the RFPA 207. More descriptions regarding the non-linear operation may be found elsewhere in the present disclosure (e.g., FIGS. 5 and 6 and relevant descriptions thereof).

The modules in the processing device 140 may be connected to or communicate with each other via a wired connection or a wireless connection. The wired connection may include a metal cable, an optical cable, a hybrid cable, or the like, or any combination thereof. The wireless connection may include a Local Area Network (LAN), a Wide Area Network (WAN), a Bluetooth™, a ZigBee™, a Near Field Communication (NFC), or the like, or any combination thereof. In some embodiments, the processing device

140 may include one or more additional modules. For example, the processing device 140 may include a storage module (not shown) used to store information and/or data related to the signal processing. As another example, the processing device 140 may include a transmission module used to transmit the processed signal (e.g., the corrected RF signal) to the RFPA 207. In some embodiments, one or more modules may be omitted in the processing device 140. For example, the non-linear correction module 1105 may be omitted in the processing device 140. The compensated RF signal generated by the gain compensation module 1103 may be directly transmitted to the RFPA 207 for amplification. In some embodiments, two or more of the modules may be combined into a single module, and any one of the modules may be divided into two or more units. For example, the gain compensation module 1103 may include a parameter obtaining unit and a compensation quantity determination unit, the functions of which are similar to the parameter obtaining unit 6111 and the compensation quantity determination unit 6112 respectively.

Figure 12:
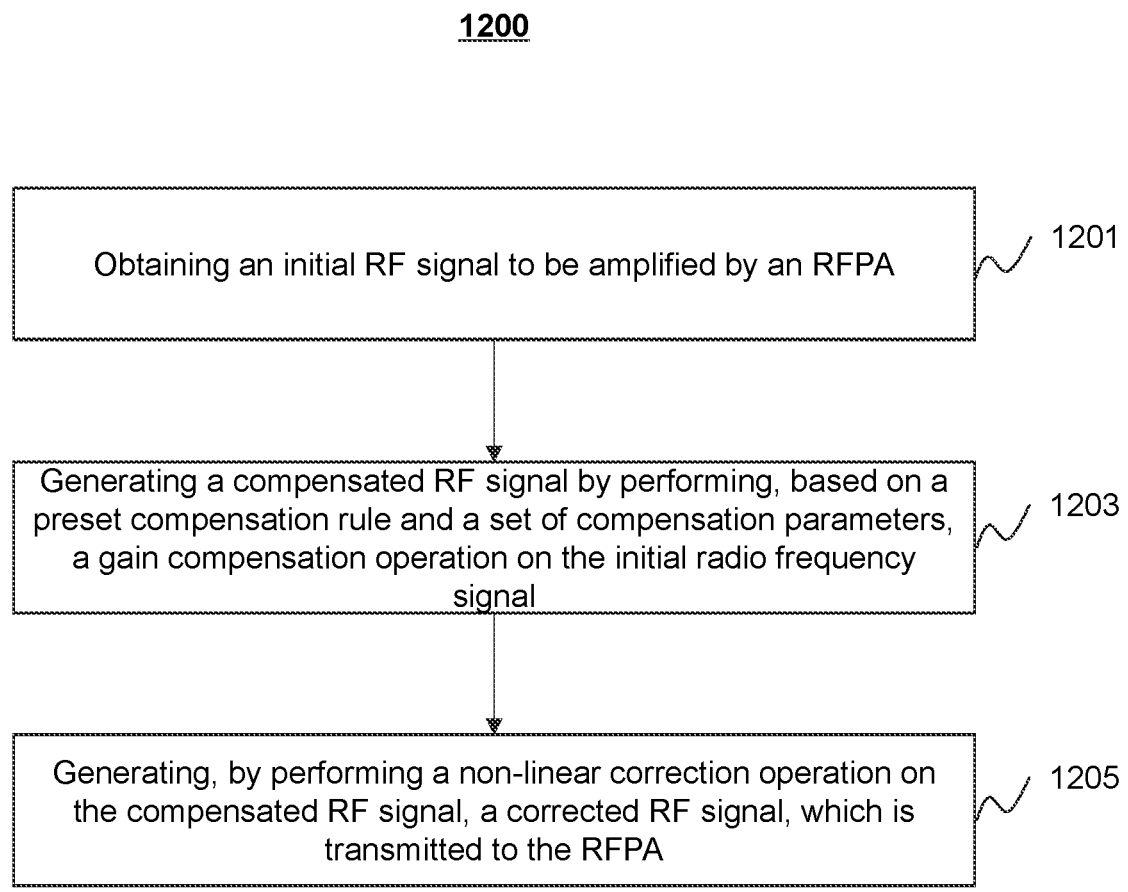
FIG. 12 is a flowchart illustrating an exemplary process for improving output stability of an RFPA according to some embodiments of the present disclosure.

FIG. 12 is a flowchart illustrating an exemplary process for improving output stability of an RFPA according to some embodiments of the present disclosure. In some embodiments, one or more operations of process 1200 illustrated in FIG. 12 may be implemented in the MRI system 100 illustrated in FIG. 1. For example, process 1200 illustrated in FIG. 12 may be stored in the storage device 130 in the form of instructions, and invoked and/or executed by the processing device 120 (e.g., the processor 210 of the computing device 3200 as illustrated in FIG. 3, the GPU 430 or CPU 440 of the mobile device 400 as illustrated in FIG. 4, and or the modules of the processing device 140 as illustrated in FIG. 10). As another example, the process 1200 may be performed by a device of the MRI device 110 (e.g., the device 510 or the device 1010).

In 1201, an initial RF signal to be transmitted by an RFPA (e.g., the RFPA 207, 610, or 1020) may be obtained. The initial RF signal may be generated by a waveform generator (e.g., the waveform generator 216) of the MRI device 110. In some embodiments, the initial RF signal may be obtained by the processing device 140 (e.g., the obtaining module 1101). In some embodiments, the initial RF signal may be obtained by the device (e.g., the first processing circuit of the device 510, or the gain compensation module 511, 611, or 1011).

In some embodiments, the initial RF signal may be the same as or similar to the RF input 501, 601, or 1001 as described elsewhere in the present disclosure. For example, the initial RF signal may be a pulse signal with a frequency in a range from 10 MHz to 1000 MHz.

In 1203, a compensated RF signal may be generated by performing, based on a preset compensation rule and a set of compensation parameters, a gain compensation operation for the initial radio frequency signal. In some embodiments, the compensated RF signal may be generated by the processing device 140 (e.g., the gain compensation module 1103). In some embodiments, the compensated RF signal may be generated by the device (e.g., the first processing circuit of the device 510, or the gain compensation module 511, 611, or 1011).

In some embodiments, the preset compensation rule may include a series of mappings between a gain compensation quantity and the set of compensation parameters. The set of compensation parameters may include a supply voltage of the RFPA, a transistor junction temperature of the RFPA, an output power of the RFPA, or the like, or any combination thereof. In some embodiments, the processing device 140 may determine a gain compensation quantity based on the preset compensation rule and the set of compensation parameters. The processing device 140 may generate the compensated RF signal based on the gain compensation quantity and the initial RF signal. For example, the processing device 140 may determine a first compensation quantity based on the supply voltage of the RFPA and the output power of the RFPA. The processing device 140 may determine a second compensation quantity based on the output power of the RFPA and the transistor junction temperature of the RFPA. The processing device 140 may determine the gain compensation quantity based on the first compensation quantity and the second compensation quantity. More descriptions regarding the gain compensation operation may be found elsewhere in the present disclosure (e.g., FIG. 6 and relevant descriptions thereof).

In 1205, a corrected RF signal, which is transmitted to the RFPA, may be generated by performing a non-linear correction operation on the compensated RF signal. In some embodiments, the corrected RF signal may be generated by the processing device 140 (e.g., the non-linear correction module 1105). In some embodiments, the corrected RF signal may be generated by the device (e.g., the second processing circuit of the device 510, or the non-linear correction module 512 or 612). More descriptions regarding the non-linear operation may be found elsewhere in the present disclosure (e.g., FIGS. 5 and 6 and relevant descriptions thereof).

It should be noted that the above descriptions of process 1200 are merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure and are within the spirit and scope of the exemplary embodiments of this disclosure.

Moreover, certain terminology has been used to describe embodiments of the present disclosure. For example, the terms "one embodiment," "an embodiment," and/or "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "unit," "module," or "system." Furthermore, aspects of the present disclosure may take the form of a computer program product embodied in one or more computer-readable media having computer-readable program code embodied thereon.

A non-transitory computer-readable signal medium may include a propagated data signal with computer readable program code embodied therein, for example, in baseband or as part of a carrier wave. Such a propagated signal may take any of a variety of forms, including electromagnetic, optical, or the like, or any suitable combination thereof. A computer-readable signal medium may be any computer-readable medium that is not a computer-readable storage medium and that may communicate, propagate, or transport a program for use by or in connection with an instruction execution system, apparatus, or device. Program code embodied on a computer-readable signal medium may be transmitted using any appropriate medium, including wireless, wireline, optical fiber cable, RF, or the like, or any suitable combination of the foregoing.

Computer program code for carrying out operations for aspects of the present disclosure may be written in any combination of one or more programming languages, including an object-oriented programming language such as Java, Scala, Smalltalk, Eiffel, JADE, Emerald, C++, C#, VB.NET, Python or the like, conventional procedural programming languages, such as the "C" programming language, Visual Basic, Fortran, Perl, COBOL, PHP, ABAP, dynamic programming languages such as Python, Ruby, and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Furthermore, the recited order of processing elements or sequences, or the use of numbers, letters, or other designations, therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software-only solution, e.g., an installation on an existing server or mobile device.

Similarly, it should be appreciated that in the foregoing description of embodiments of the present disclosure, various features are sometimes grouped together in a single embodiment, figure, or description thereof to streamline the disclosure aiding in the understanding of one or more of the various inventive embodiments. This method of disclosure, however, is not to be interpreted as reflecting an intention that the claimed object matter requires more features than are expressly recited in each claim. Rather, inventive embodiments lie in less than all features of a single foregoing disclosed embodiment.

In some embodiments, the numbers expressing quantities, properties, and so forth, used to describe and claim certain embodiments of the application are to be understood as being modified in some instances by the term "about," "approximate," or "substantially." For example, "about," "approximate," or "substantially" may indicate ±20% variation of the value it describes, unless otherwise stated. Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable.

Each of the patents, patent applications, publications of patent applications, and other material, such as articles, books, specifications, publications, documents, things, and/or the like, referenced herein is hereby incorporated herein by this reference in its entirety for all purposes, excepting any prosecution file history associated with same, any of same that is inconsistent with or in conflict with the present document, or any of same that may have a limiting effect as to the broadest scope of the claims now or later associated with the present document. By way of example, should there be any inconsistency or conflict between the description, definition, and/or the use of a term associated with any of the incorporated material and that associated with the present document, the description, definition, and/or the use of the term in the present document shall prevail.

In closing, it is to be understood that the embodiments of the application disclosed herein are illustrative of the principles of the embodiments of the application. Other modifications that may be employed may be within the scope of the application. Thus, by way of example, but not of limitation, alternative configurations of the embodiments of the application may be utilized in accordance with the teachings herein. Accordingly, embodiments of the present application are not limited to that precisely as shown and described.

What is claimed is:

1. A system for improving output stability of a radio frequency power amplifier (RFPA), comprising:
   a first processing circuit configured to
   obtain an initial radio frequency signal to be amplified by the RFPA;
   generate a compensated radio frequency signal by performing, based on a preset compensation rule and a set of compensation parameters, a gain compensation operation for the initial radio frequency signal, wherein the preset compensation rule includes a series of mapping relationships between a gain compensation quantity and the set of compensation parameters, the set of compensation parameters includes a supply voltage of the RFPA and a transistor junction temperature of the RFPA, and the transistor junction temperature of the RFPA is designated to be an actual maximum temperature of the RFPA, or a sum of an ambient temperature and a transistor junction temperature rise of the RFPA; and a second processing circuit configured to generate, by performing a non-linear correction operation on the compensated radio frequency signal, a corrected radio frequency signal, which is transmitted to the RFPA.

2. The system of claim 1, wherein the set of compensation parameters further includes an output power of the RFPA.

3. The system of claim 2, wherein to generate a compensated radio frequency signal by performing, based on a preset compensation rule relating to a set of compensation parameters, a gain compensation operation for the initial radio frequency signal, the first processing circuit is further configured to:

determine the gain compensation quantity based on the preset compensation rule and the set of compensation parameters; and generate the compensated radio frequency signal based on the gain compensation quantity and the initial radio frequency signal.

4. The system of claim 3, wherein to determine a gain compensation quantity based on the preset compensation rule and the set of compensation parameters, the first processing circuit is further configured to:

determine a first compensation quantity based on the supply voltage of the RFPA and the output power of the RFPA;

determine a second compensation quantity based on the output power of the RFPA and the transistor junction temperature of the RFPA; and determining the gain compensation quantity based on the first compensation quantity and the second compensation quantity.

5. The system of claim 4, wherein to determine the gain compensation quantity based on the first compensation quantity and the second compensation quantity, the first processing circuit is further configured to:

designate a sum of the first compensation quantity and the second compensation quantity as the gain compensation quantity; or designate a product of the first compensation quantity and the second compensation quantity as the gain compensation quantity.

6. The system of claim 1, wherein the series of mapping relationships between the gain compensation quantity and the set of compensation parameters are listed in a gain compensation table, and the gain compensation table lists the series of mapping relationships between the gain compensation quantity of the RFPA and the set of compensation parameters.

7. The system of claim 1, wherein the series of mapping relationships between the gain compensation quantity and the set of compensation parameters are determined by data fitting based on a function that incorporates the gain compensation quantity and the set of compensation parameters.

8. The system of claim 2, wherein the first processing circuit is further configured to:

determine a first compensation quantity based on the supply voltage of the RFPA and the output power of the RFPA;

determine a second compensation quantity based on the output power of the RFPA and the transistor junction temperature of the RFPA; and determine the gain compensation quantity based on the first compensation quantity and the second compensation quantity.

9. The system of claim 1, wherein the first processing circuit is further configured to:

calculate the transistor junction temperature rise of the RFPA based on a power dissipation of the RFPA and an equivalent thermal resistance of the RFPA.

10. The system of claim 9, wherein the power dissipation of the RFPA based on an output power of the RFPA, the supply voltage of the RFPA, and a drain current of the RFPA.

11. The system of claim 1, wherein a frequency of the initial radio frequency signal is in a range from 10 megahertz to 1000 megahertz.

12. The system of claim 1, wherein the initial radio frequency signal is a pulse signal.

13. The system of claim 1, wherein a peak power of the RFPA is greater than 8 kilowatts.

14. The system of claim 1, wherein the set of compensation parameters further includes a drain current of the RFPA.

15. The system of claim 1, wherein the preset compensation rule includes a gain compensation model that reflects the series of mapping relationships between the gain compensation quantity of the RFPA and the set of compensation parameters.

16. A method for improving output stability of a radio frequency power amplifier (RFPA), the method being implemented on one or more processing circuits operably connected with the RFPA, the method comprising:

obtaining an initial radio frequency signal to be amplified by the RFPA;

generating a compensated radio frequency signal by performing, based on a preset compensation rule and a set of compensation parameters, a gain compensation operation for the initial radio frequency signal, wherein the preset compensation rule includes a series of mapping relationships between a gain compensation quantity and the set of compensation parameters, the set of compensation parameters includes a supply voltage of the RFPA and a transistor junction temperature of the RFPA, and the transistor junction temperature of the RFPA is designated to be an actual maximum temperature of the RFPA, or a sum of an ambient temperature and a transistor junction temperature rise of the RFPA; and generating, by performing a non-linear correction operation on the compensated radio frequency signal, a corrected radio frequency signal, which is transmitted to the RFPA.

17. The method of claim 16, wherein the set of compensation parameters further includes an output power of the RFPA.

18. The method of claim 17, wherein the generating a compensated radio frequency signal by performing, based on a preset compensation rule relating to a set of compensation parameters, a gain compensation operation for the initial radio frequency signal includes:

determining the gain compensation quantity based on the preset compensation rule and the set of compensation parameters; and generating the compensated radio frequency signal based on the gain compensation quantity and the initial radio frequency signal.

19. The method of claim 18, wherein the determining a gain compensation quantity based on the preset compensation rule and the set of compensation parameters includes:

determining a first compensation quantity based on the supply voltage of the RFPA and the output power of the RFPA;

determining a second compensation quantity based on the output power of the RFPA and the transistor junction temperature of the RFPA; and determining the gain compensation quantity based on the first compensation quantity and the second compensation quantity.

20. A radio frequency system, comprising:

one or more processing circuits configured to obtain an initial radio frequency signal to be amplified by a radio frequency power amplifier (RFPA), generate a compensated radio frequency signal by performing, based on a preset compensation rule and a set of compensation parameters, a gain compensation operation for the initial radio frequency signal for improving output stability of the RFPA, wherein the preset compensation rule includes a series of mapping relationships between a gain compensation quantity and the set of compensation parameters, the set of compensation parameters includes a supply voltage of the RFPA and a transistor junction temperature of the RFPA, the transistor junction temperature of the RFPA is designated to be an actual maximum temperature of the RFPA, or a sum of an ambient temperature and a transistor junction temperature rise of the RFPA, and generate, by performing a non-linear correction operation on the compensated radio frequency signal, a corrected radio frequency signal, which is transmitted to the RFPA;

the RFPA configured to generate an amplified radio frequency signal by amplifying the corrected compensated radio frequency signal; and radio frequency coils configured to generate, after being driven by the amplified radio frequency signal, a radio frequency magnetic field for imaging.

* * * * *